(12) United States Patent
Hsu et al.

(10) Patent No.: US 10,741,404 B2
(45) Date of Patent: Aug. 11, 2020

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Feng-Cheng Hsu, New Taipei (TW); Shuo-Mao Chen, New Taipei (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/806,342

(22) Filed: Nov. 8, 2017

(65) Prior Publication Data

US 2019/0139896 A1 May 9, 2019

(51) Int. Cl.
*H01L 21/304* (2006.01)
*H01L 23/538* (2006.01)
(Continued)

(52) U.S. Cl.
CPC .......... *H01L 21/3043* (2013.01); *B28D 5/00* (2013.01); *H01L 21/02109* (2013.01); *H01L 21/486* (2013.01); *H01L 21/4853* (2013.01); *H01L 21/4857* (2013.01); *H01L 21/565* (2013.01); *H01L 21/67092* (2013.01); *H01L 21/6835* (2013.01); *H01L 21/6836* (2013.01); *H01L 21/78* (2013.01); *H01L 23/28* (2013.01); *H01L 23/3114* (2013.01); *H01L 23/3675* (2013.01); *H01L 23/49811* (2013.01); *H01L 23/5383* (2013.01); *H01L 23/5384* (2013.01);

*H01L 23/5386* (2013.01); *H01L 23/5389* (2013.01); *H01L 23/562* (2013.01); *H01L 24/19* (2013.01); *H01L 24/20* (2013.01); *H01L 25/105* (2013.01); *H01L 25/50* (2013.01); *H01L 23/3128* (2013.01); *H01L 2221/68345* (2013.01); *H01L 2221/68359* (2013.01); *H01L 2224/023* (2013.01); *H01L 2224/214* (2013.01);

(Continued)

(58) Field of Classification Search
CPC .......... H01L 2924/3511; H01L 23/563; H01L 23/28; H01L 2224/023–024; H01L 25/043; H01L 25/0657; H01L 25/074; H01L 25/0756; H01L 25/117
See application file for complete search history.

(56) References Cited

U.S. PATENT DOCUMENTS 9,000,584 B2  4/2015 Lin et al.
9,048,222 B2  6/2015 Hung et al.
(Continued)

*Primary Examiner* — Selim U Ahmed
*Assistant Examiner* — Evan G Clinton
(74) *Attorney, Agent, or Firm* — JCIPRNET

(57) ABSTRACT

A package structure and a method of manufacturing the same are provided. The package structure includes a die, an encapsulant, a RDL structure and a protection layer. The die includes a first surface and a second surface opposite to each other. The encapsulant is aside the die. The RDL structure is electrically connected to the die though a plurality of conductive bumps. The RDL structure is underlying the second surface of the die and the encapsulant. The protection layer is located over the first surface of the die and the encapsulant. The protection layer is used for controlling the warpage of the package structure.

20 Claims, 26 Drawing Sheets

(51) Int. Cl.
  *H01L 23/31* (2006.01)
  *H01L 23/00* (2006.01)
  *H01L 23/367* (2006.01)
  *H01L 25/10* (2006.01)
  *H01L 21/48* (2006.01)
  *H01L 21/56* (2006.01)
  *H01L 25/00* (2006.01)
  *H01L 23/28* (2006.01)
  *H01L 21/02* (2006.01)
  *H01L 21/67* (2006.01)
  *H01L 21/78* (2006.01)
  *H01L 21/683* (2006.01)
  *B28D 5/00* (2006.01)
  *H01L 23/498* (2006.01)

(52) U.S. Cl.
  CPC ............... *H01L 2225/1035* (2013.01); *H01L 2225/1058* (2013.01); *H01L 2225/1094* (2013.01); *H01L 2924/19011* (2013.01); *H01L 2924/19106* (2013.01); *H01L 2924/3511* (2013.01)

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2013/0249106 A1* | 9/2013 | Lin | H01L 24/19 257/774 |
| 2014/0091454 A1* | 4/2014 | Lin | H01L 24/19 257/734 |
| 2015/0255360 A1* | 9/2015 | Hsu | H01L 23/3128 257/687 |
| 2017/0025359 A1* | 1/2017 | Tsai | H01L 21/486 |
| 2017/0133310 A1* | 5/2017 | Kelly | H01L 23/49816 |
| 2017/0278766 A1* | 9/2017 | Kim | H01L 24/20 |
| 2017/0301650 A1* | 10/2017 | Yu | H01L 23/295 |
| 2017/0316957 A1* | 11/2017 | Chen | H01L 21/486 |
| 2018/0012857 A1* | 1/2018 | Lin | H01L 23/49827 |
| 2018/0254232 A1* | 9/2018 | Lai | H01L 23/16 |

* cited by examiner

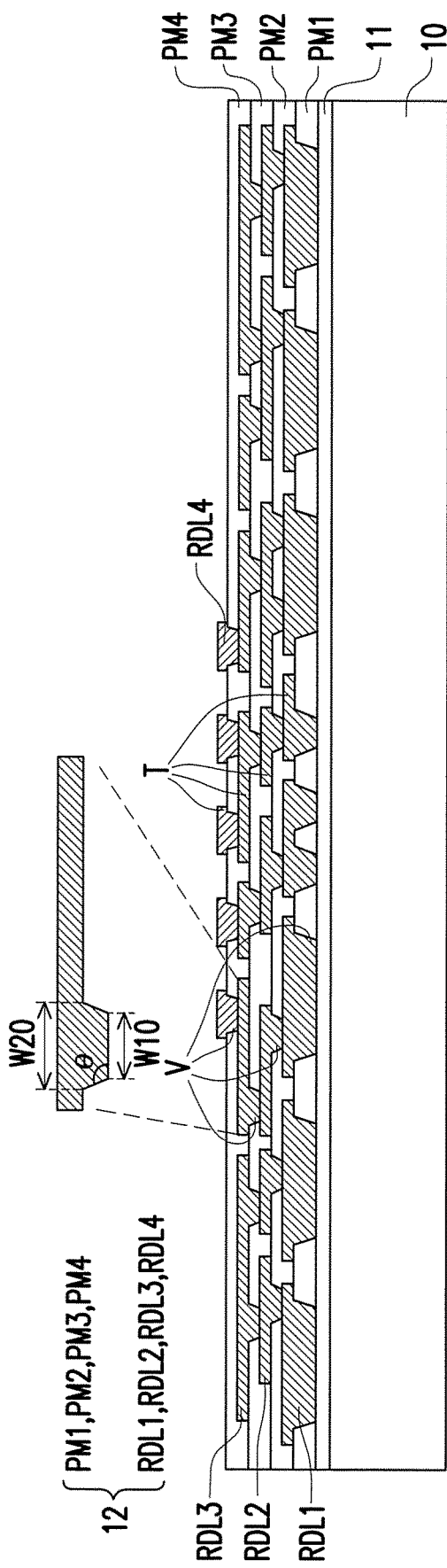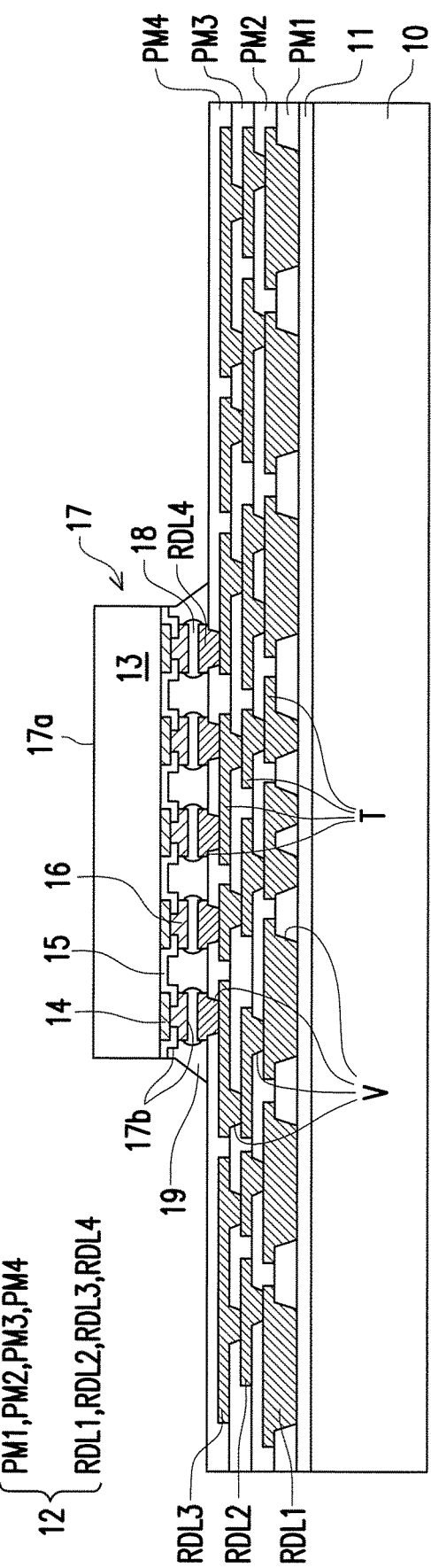
FIG. 1A
FIG. 1B

PACKAGE STRUCTURE AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

BRIEF DESCRIPTION OF THE DRAWINGS

FIG. 1A to FIG. 1F are schematic cross-sectional views illustrating a method of manufacturing a package structure according to a first embodiment of the disclosure.

DETAILED DESCRIPTION

Figure 1C:
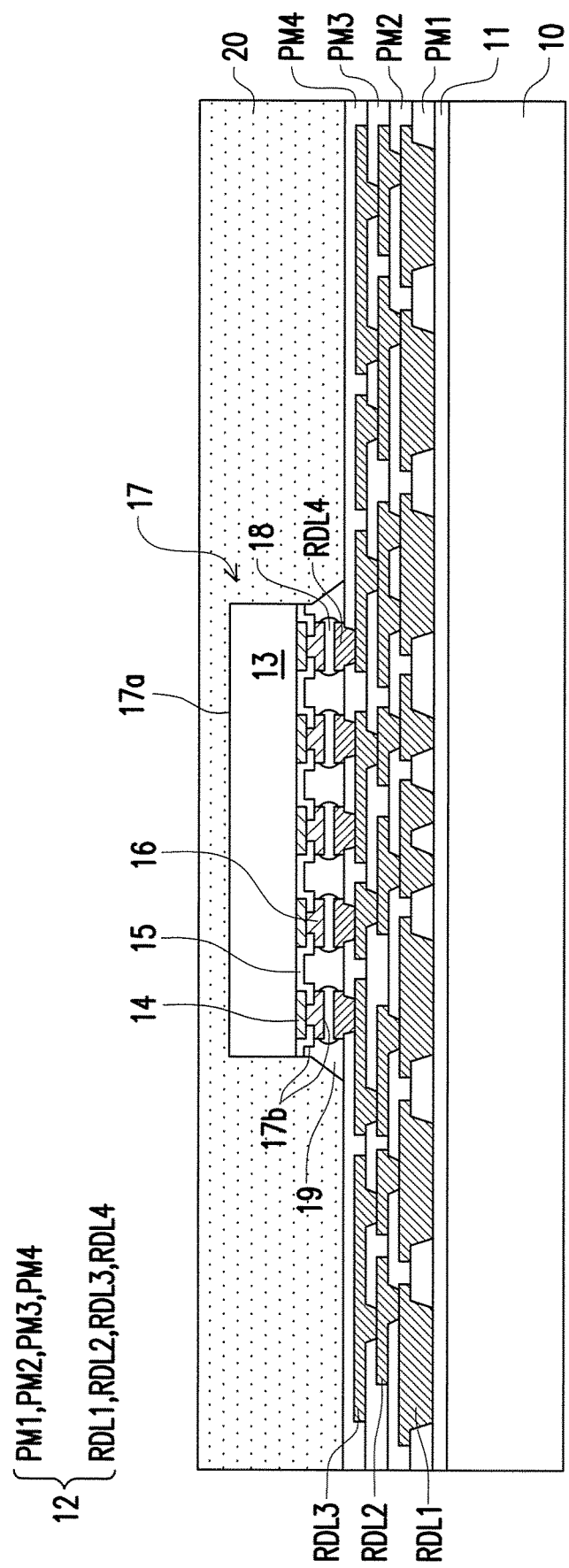

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic cross-sectional views illustrating a method of manufacturing a package structure according to a first embodiment of the disclosure.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

A redistribution layer (RDL) structure 12 is formed over the carrier 10 and the de-bonding layer 11. In some embodiments, the RDL structure 12 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure. In some embodiments, the RDL structure 12 comprises at least three RDL layers. In some embodiments, the RDL structure 12 is free of substrate.

In some embodiments, the redistribution layer RDL1 penetrates through the polymer layer PM1, and the bottom surface of the redistribution layer RDL1 and the bottom surface of the polymer layer PM1 are substantially level with each other, and are in contact with the de-bonding layer 11. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3.

In some embodiments, the redistribution layer RDL4 is also referred as pads, and is located in a region for collecting to a die in the subsequently processes. In some embodiments, the redistribution layer RDL4 protrudes from the top surface of the polymer layer PM4 and exposed, that is, the top surface of the redistribution layer RDL4 is higher than the top surface of the polymer layer PM4, but the disclosure is not limited thereto. In some other embodiments, the top surface of the redistribution layer may be substantially level with the top surface of the polymer layer PM4.

In some embodiments, the redistribution layers RDL1, RDL2, RDL3 and RDL4 respectively includes a plurality of vias V and a plurality of traces T connected to each other. The vias V penetrates through the polymer layers PM1, PM2, PM3 and PM4 to connect the traces T of the redistribution layers RDL1, RDL1, RDL3 and RDL4, and the traces T are respectively located on the polymer layers PM1, PM2, PM3 and PM4, and are respectively extending on the top surface of the polymer layers PM1, PM2, PM3 and PM4.

Referring to the enlarged view of the via V and the trace T in FIG. 1A, in some embodiments, the cross-section shape of the via V is inverted trapezoid, but the disclosure is not limited thereto. In some embodiments, the base angle θ of the via V is an obtuse angle, and the width W20 of top surface of the via V is larger than the width W10 of the bottom surface of the via V. In some embodiments, the top surface of the via V has a larger area than the bottom surface of the via V. In some other embodiments, the cross-section shape of the via V may be square or rectangle, and the base angle θ of the via V is a right angle.

In some embodiments, the polymer layers PM1, PM2, PM3 and PM4 respectively includes a photo-sensitive material such as polybenzoxazole (PBO), polyimide (PI), benzocyclobutene (BCB), a combination thereof or the like. The forming methods of the polymer layers PM1, PM2, PM3 and PM4 include suitable fabrication techniques such as spin coating, chemical vapor deposition (CVD), plasma-enhanced chemical vapor deposition (PECVD), lamination or the like. In some embodiments, the redistribution layers RDL1, RDL2, RDL3 and RDL4 respectively includes conductive materials. The conductive material includes metal such as copper, nickel, titanium, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

Referring to FIG. 1B, a die 17 is placed over and electrically connected to the RDL structure 12. Specifically, the die 17 is connected to the redistribution layer RDL4 of the RDL structure 12 though a plurality of conductive bumps 18. The die 17 may be an application-specific integrated circuit (ASIC) chip, an analog chip, a sensor chip, a wireless and radio frequency chip, a voltage regulator chip or a memory chips. The number of the die 17 shown in FIG. 1B is merely for illustration, and the disclosure is not limited thereto. In some embodiments, two or more dies 17 may be mounted onto the RDL structure 12, and the two or more dies 17 may be the same types of dies or the different types of dies.

In some embodiments, the die 17 includes a substrate 13, a plurality of pads 14, a passivation layer 15 and a plurality of connectors 16. The pads 14 may be a part of an interconnection structure (not shown) and electrically connected to the integrated circuit devices (not shown) of the die 17. The passivation layer 15 covers a portion of the pads 14. The passivation layer 15 includes an insulating material such as silicon oxide, silicon nitride, polymer, or a combination thereof. A portion of the pads 14 is exposed by the passivation layer 15 and serves as an external connection of the die 17. The connectors 16 are contacted with and electrically connected to the pads 14 not covered by the passivation layer 15. The connector 16 includes solder bumps, gold bumps, copper bumps, copper posts, copper pillars, or the like.

The die 17 has a first surface 17a (that is, the top surface) and a second surface 17b (that is, the bottom surface) opposite to each other. In some embodiments, the first surface 17a is a surface of the substrate 13 away from the connectors 16. The second surface 17b is an active surface 17b of the die 17 facing the top surface of the RDL structure 12, in some embodiments, the second surface 17b includes a portion of the surface of the connectors 16 and a portion of the surface of the passivation layer 15. That is to say, the RDL structure 12 is located at a front-side (a side close to the connectors 16) of the die 17. In some embodiments, the top surface of the via V of the RDL structure 12 is relatively closer to the second surface 17b of the die 17 than the bottom surface of the via V, and the bottom surface of the via V of the RDL structure 12 is relatively farther away from the second surface 17b of the die 17 than the top surface of the via V. In other word, in some embodiments, the top surface of the via V with a larger area is relatively closer to the active surface 17b of the die 17 than the bottom surface of the via V.

Still referring to FIG. 1B, the conductive bumps 18 are located between the connectors 16 of the die 17 and the redistribution layer RDL4 of the RDL structure 12. In some embodiments, the conductive bumps 18 further covers a portion of sidewalls of the connector 16 and a portion of sidewalls of the RDL4. In some embodiments, the conductive bumps 18 are solder bumps, silver balls, copper balls, or any other suitable metallic balls. In some embodiments, a soldering flux (not shown) may be applied onto the conductive bumps 18 for better adhesion. In some embodiments, after the die 17 is connected to the RDL structure 12, an underfill layer 19 is formed to fill the space between the die 17 and the RDL structure 12, so as to cover the active surface 17b of the die 17 and a portion of the top surface of the polymer layer PM4, and surrounds the connectors 16, the conductive bumps 18 and the redistribution layer RDL4. In some embodiments, the underfill layer 19 further covers a portion of sidewalls of the die 17. In some embodiments, the underfill layer 19 includes polymer such as epoxy.

Referring to FIG. 1C, an encapsulant 20 is then formed on the RDL structure 12 to encapsulate the sidewalls of the die 17, the first surface 17a of the die 17 and the sidewalls of the underfill layer 19. In some embodiments, the encapsulant 20 includes a molding compound, a molding underfill, a resin such as epoxy, a combination thereof, or the like. In some other embodiments, the encapsulant 20 includes a photo-sensitive material such as PBO, polyimide, BCB, a combination thereof, or the like, which may be easily patterned by exposure and development processes or laser drilling process. In alternative embodiments, the encapsulant 20 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 20 is formed by a suitable fabrication technique such as spin-coating, lamination, deposition, or similar processes. In some embodiments, the top surface of the encapsulant 20 is higher than or over the first surface 17a of the die 17, such that the first surface 17a of the die 17 is encapsulated by the encapsulant 20. However, the present disclosure is not limited thereto.

Figure 1D:
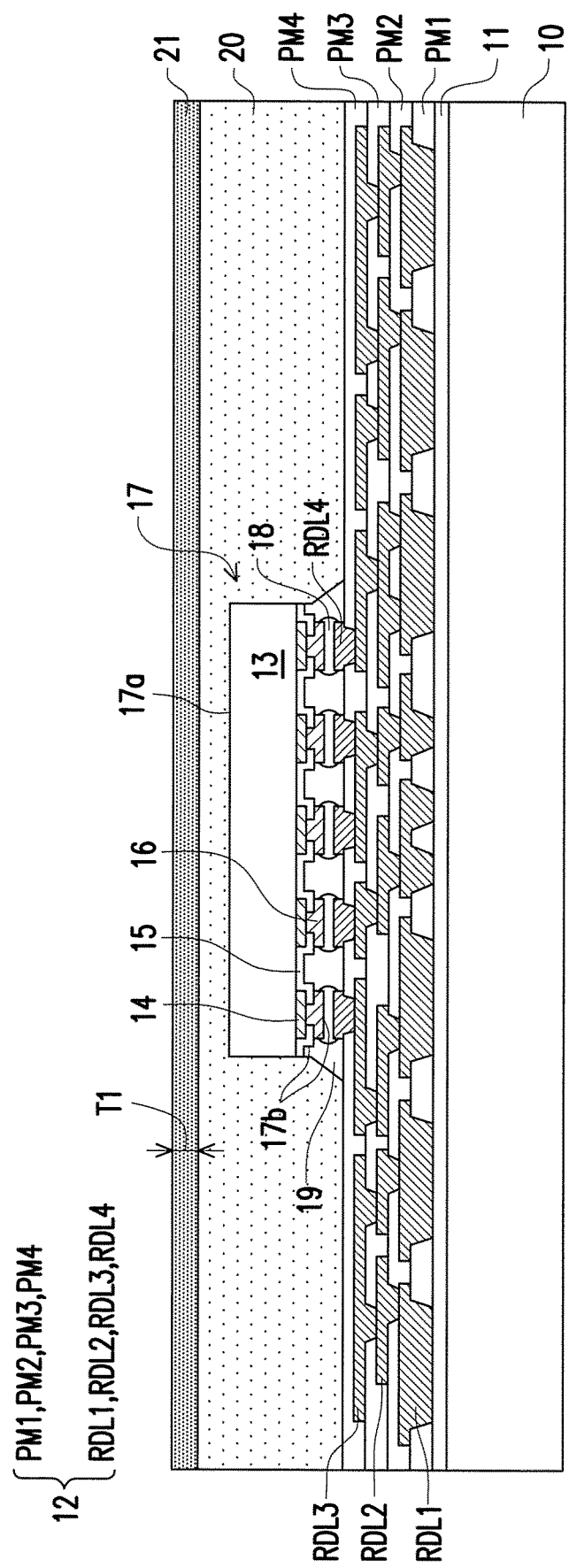

Referring to FIG. 1D, in some embodiments, a protection layer 21 is then formed over the die 17 and the encapsulant 20. In other words, the protection layer 21 is a backside film formed at the backside (opposite to the front-side) of the die 17. In some embodiments, the protection layer 21 completely covers the top surface of the encapsulant 20. In some embodiments, the protection layer 21 is referred as a warpage control layer, and preferably provides a sufficient degree of rigidity to the underlying structure, so as to control the warpage of the underlying structure. The protection layer 21 may comprise a single-layer structure or a multi-layer structure. In some embodiments, the protection layer 21 includes an inorganic material, an organic material, or a combination thereof. The inorganic material includes silicon nitride, a low temperature nitride such as aluminum nitride, gallium nitride, aluminum gallium nitride or the like, or a combination thereof. The organic dielectric material includes a polymer such as PBO, PI, BCB, ajinomoto buildup film (ABF), solder resist film (SR), or the like, or a combination thereof. However, the present disclosure is not limited thereto, the protection layer 21 may include any kind of materials, as long as it provides a sufficient degree of rigidity to the underlying structure against warpage and twisting. The protection layer 21 is formed by a suitable fabrication technique such as spin-coating, lamination, chemical vapor deposition (CVD), plasma-enhanced chemical vapor deposition (PECVD) or the like, for example. In some embodiments, the thickness T1 of the protection layer 21 ranges from 5 μm to 100 μm.

Figure 1E:
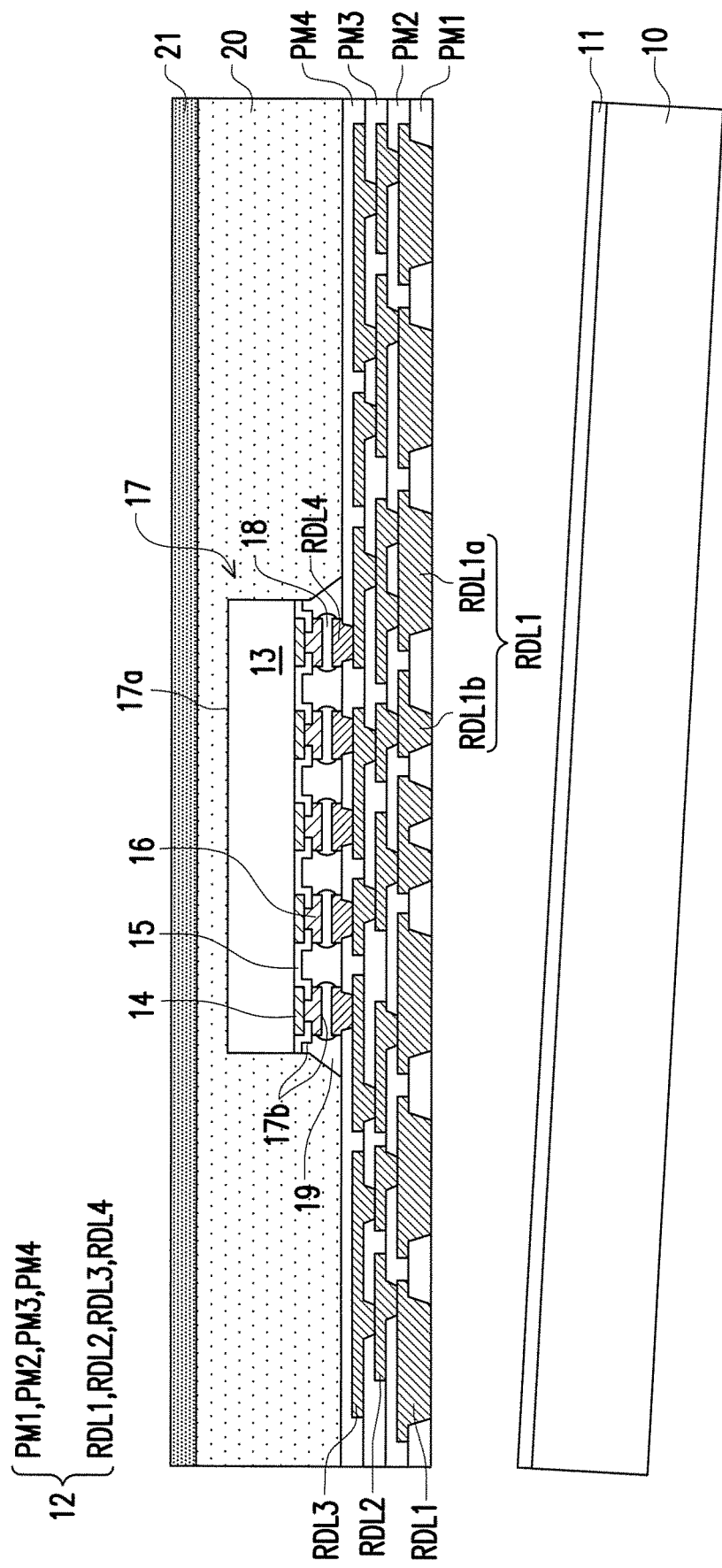

Referring to FIG. 1E, the de-bonding layer 11 is decomposed under the heat of light, and the carrier 10 is then released from the overlying structure. In some embodiments, before the carrier 10 is released, a frame tape (not shown) is attached to the protection layer 21, and the frame tape is removed after the carrier 10 is released. Thereafter, the redistribution layer RDL1 is exposed for electrical connection in the subsequent process. In some embodiments, the redistribution layer RDL1 includes a redistribution layer RDL1a and a redistribution layer RDL1b. The redistribution layer RDL1a is also referred as under-ball metallurgy (UBM) layer for ball mounting. The redistribution layer RDL1b may be micro bump for connecting to an integrated passive device (IPD) 24 in the subsequent process.

Figure 1F:
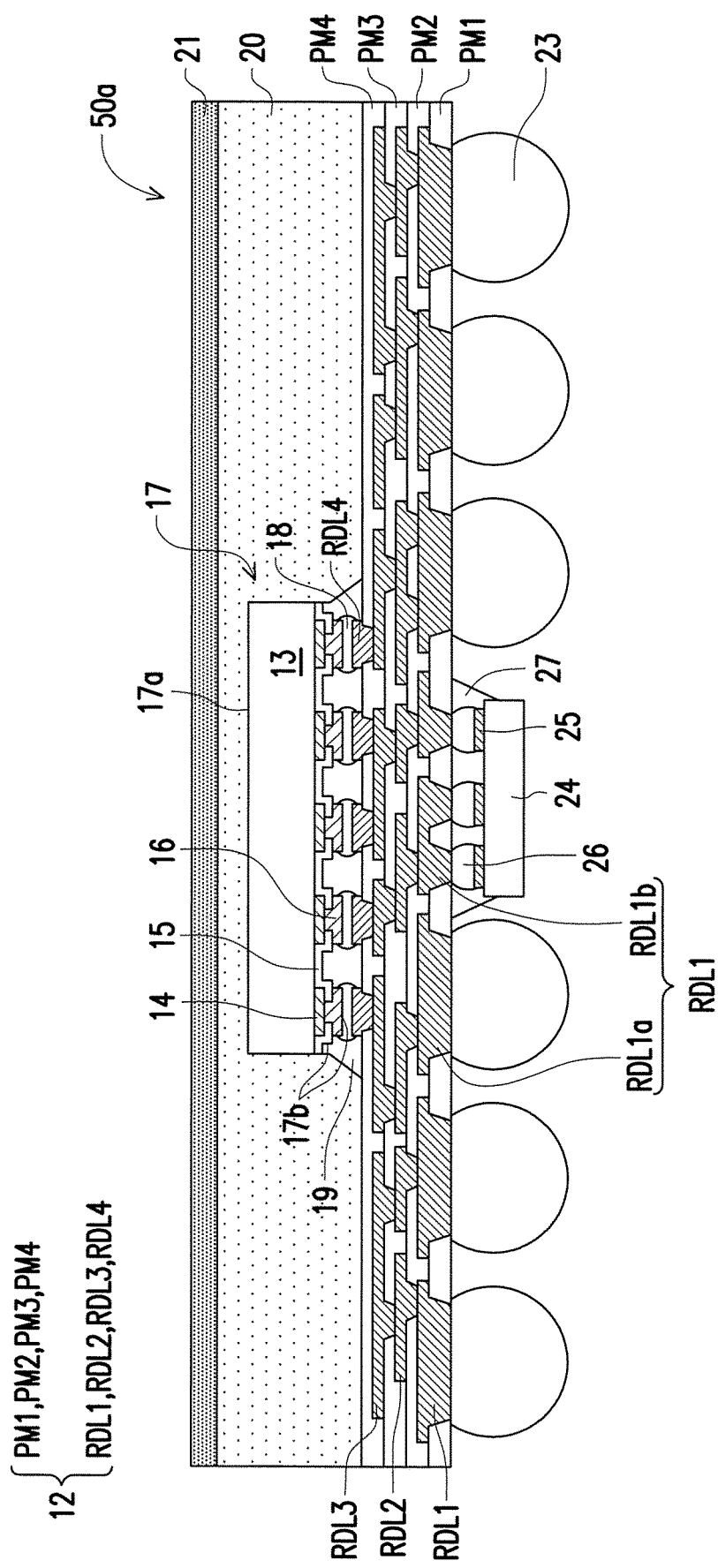

Referring to FIG. 1E and FIG. 1F, a plurality of connectors 23 are formed on and electrically connected to the redistribution layer RDL1a of the RDL structure 12. In some embodiments, the connectors 23 are referred as conductive terminals. In some embodiments, the connectors 23 are, for example, solder balls or ball grid array (BGA) balls. In some embodiments, the material of the connector 23 includes copper, aluminum, lead-free alloys (e.g., gold, tin, silver, aluminum, or copper alloys) or lead alloys (e.g., lead-tin alloys). In some embodiments, the connectors 23 are placed on the redistribution layer RDL1a by a ball mounting process.

Still referring to FIG. 1F, in some embodiments, an integrated passive device (IPD) 24 including a plurality of pads 25 is electrically connected to the redistribution layer RDL1b through a plurality of conductive bumps 26 therebetween. The IPD 24 may be a capacitor, a resistor, an inductor or the like, or a combination thereof. The IPD 24 is optionally connected to the RDL structure 12, and the number of the IPD 24 is not limited to that is shown in FIG. 1F, but may be adjusted according to the design of the product. An underfill layer 27 is formed to fill the space between the IPD 24 and the RDL structure 12. The underfill layer 27 covers a portion of the surface of the IPD 24 and a portion of the bottom surface of the RDL structure 12, and surrounds the pads 15 of the IPD 24 and the conductive bumps 26. The material of the underfill layer 27 is similar to that of the underfill layer 19, which is not described again.

Still referring to FIG. 1F, a package structure 50a is thus completed. The package structure 50a includes the die 17, the encapsulant 20, the RDL structure 12, the connectors 23, the IPD 24 and the protection layer 21. The connectors 23 and the IPD 24 are electrically connected to the die 17 through the RDL structure 12. The protection layer 21 is formed for controlling the warpage of the package structure 50a, that is, the protection layer 21 provides a sufficient degree of rigidity to the package structure 50a against warpage and twisting. Thereafter, the package structure 50a may be connected to other package components such as a printed circuit board (PCB), a flex PCB, or the like through the connectors 23.

In the package structure 50a, the encapsulant 20 encapsulates the sidewalls and the first surface 17a of the die 17. However, the present disclosure is not limited thereto.

Figure 2A:
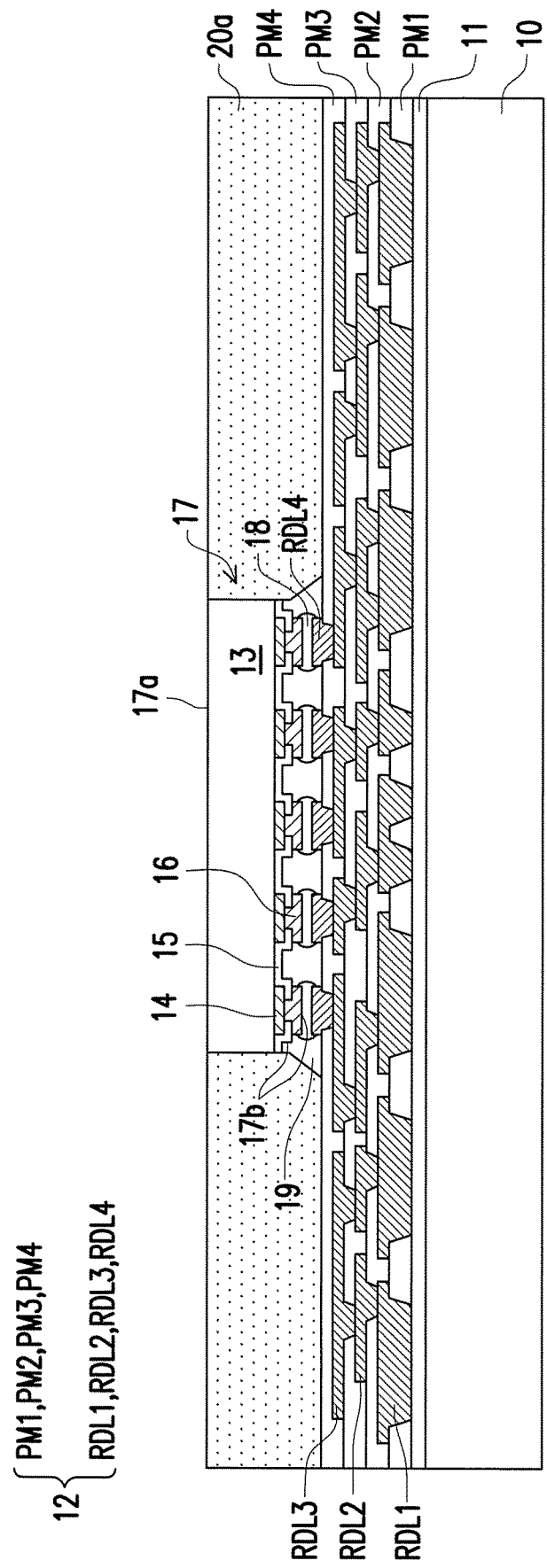
FIG. 2A to FIG. 2B are schematic cross-sectional views illustrating a method of manufacturing a package structure according to some embodiments of the disclosure.

Referring to FIG. 2A, processes similar to those of FIGS. 1A to 1C are performed, in some embodiments, after the encapsulant 20 is formed as shown in FIG. 1C, a grinding or polishing process such as a chemical mechanical polishing (CMP) process is performed to remove a portion of the encapsulant 20, such that the first surface 17a of the die 17 is exposed, and an encapsulant 20a encapsulating the sidewalls of the die 17 is formed. In some embodiments, the top surface of the encapsulant 20a is substantially coplanar with the first surface 17a of the die 17.

Figure 2B:
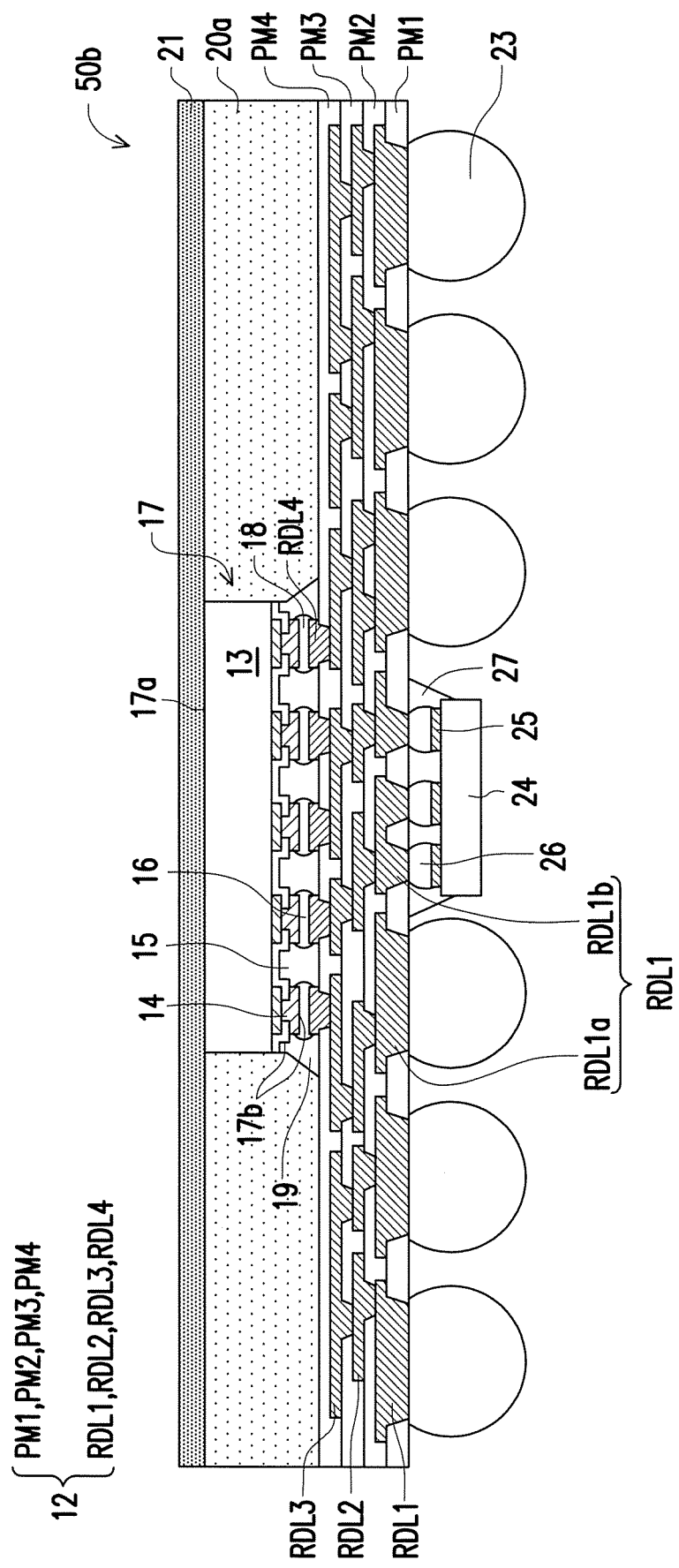

Referring to FIG. 2B, after the encapsulant 20a is formed, processes similar to those of FIG. 1D to FIG. 1F are performed subsequently, so as to form a package structure 50b. The package structure 50b differs from the package structure 50a in that the top surface of the encapsulant 20a is substantially level with the first surface 17a of the die 17, and the protection layer 21 is in contact with the top surface of the encapsulant 20a and the first surface 17a of the die 17. In some embodiments, the protection layer 21 completely covers the top surface of the encapsulant 20a and the first surface 17a of the die 17. The other structural characteristics of the package structure 50b are similar to those of the package structure 50a, which is not described again.

FIG. 3A to FIG. 3H are schematic cross-sectional views illustrating a method of manufacturing a package structure according to a second embodiment of the disclosure. The second embodiments differs from the first embodiment in that a plurality of through integrated fan-out vias (TIVs) 28 are formed aside the die 17.

Figure 3A:
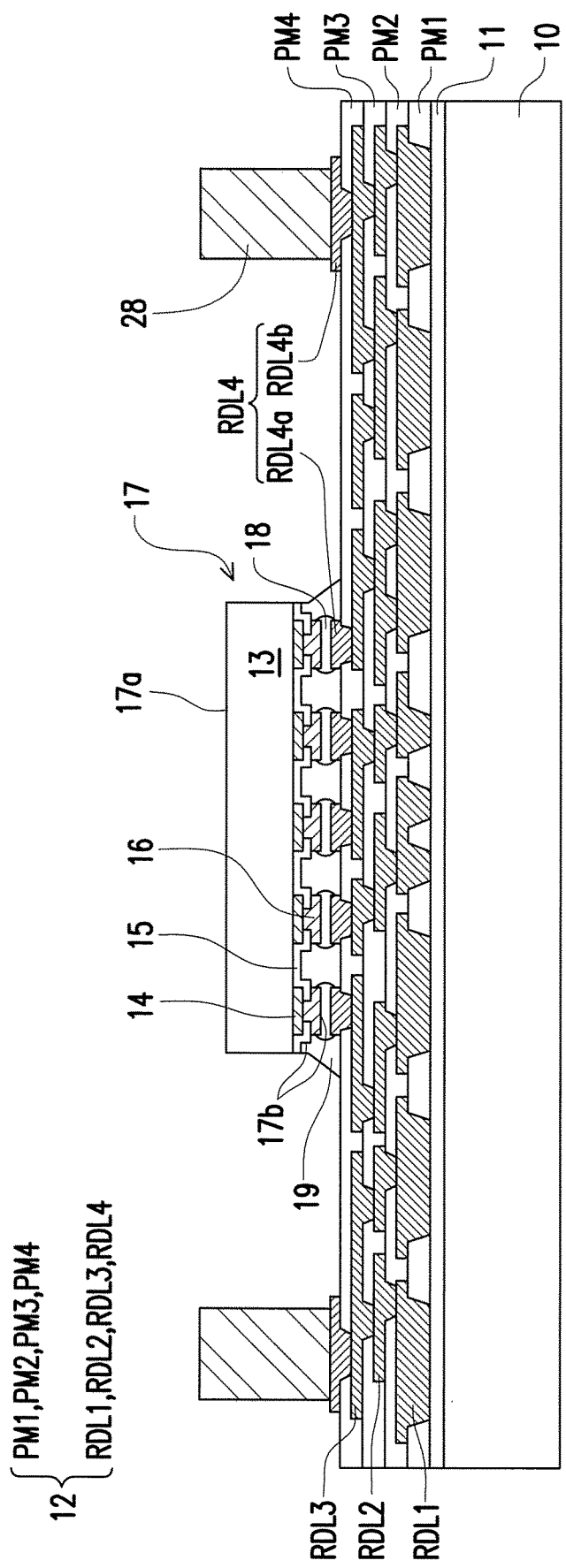
FIG. 3A to FIG. 3H are schematic cross-sectional views illustrating a method of manufacturing a package structure according to a second embodiment of the disclosure.

Referring to FIG. 3A, similar to the processes of FIGS. 2A and 2B, a RDL structure 12 including polymer layers PM1, PM2, PM3, PM4 and redistribution layers RDL1, RDL2, RDL3, RDL4 is formed over a carrier 10. In some embodiments, the redistribution layer RDL4 includes a redistribution layer RDL4a and a redistribution layer RDL4b. The redistribution layer RDL4b is located aside and around the redistribution layer RDL4a. A die 17 is placed on and electrically connected to the redistribution layer RDL4a through a plurality of conductive bumps 18. An underfill layer 19 is formed to fill the space between the die 17 and the RDL structure 12. The structural characteristics of the die 17, the RDL structure 12, the conductive bumps 18 and the underfill layer 19 are similar to those of the first embodiments, which will not be described again.

A plurality of TIVs 28 are formed on and electrically connected to the redistribution layer RDL4b. In some embodiments, the TIVs 28 include copper, nickel, solder, alloys thereof, or the like. In some embodiments, the TIV 28 includes a seed layer and a conductive layer formed thereon (not shown). The seed layer is, for example, a titanium or/and copper composited layer. The conductive layer is, for example, a copper layer. An exemplary forming method of the TIVs 28 includes forming a photoresist layer such as a dry film resist over the carrier 10. Thereafter, openings are formed in the photoresist layer, the openings exposes a portion of the top surface of the redistribution layer RDL4*b*, and the TIVs 28 are then formed in the openings by electroplating. In some other embodiments, the TIVs 28 further include a barrier layer (not shown) under the seed layer to prevent metal diffusion. The material of the barrier layer includes, for instance, metal nitride such as titanium nitride, tantalum nitride, or a combination thereof.

Still referring to FIG. 3A, the die 17 is located between and surrounded by the TIVs 28, that is, the TIVs 28 are aside or around the die 17. In some embodiments, the top surface of the TIV 28 is higher than the first surface 17*a* of the die 17, but the disclosure is not limited thereto. In some other embodiments, the top surface of the TIV 28 is substantially level with the first surface 17*a* of the die 17.

Figure 3B:
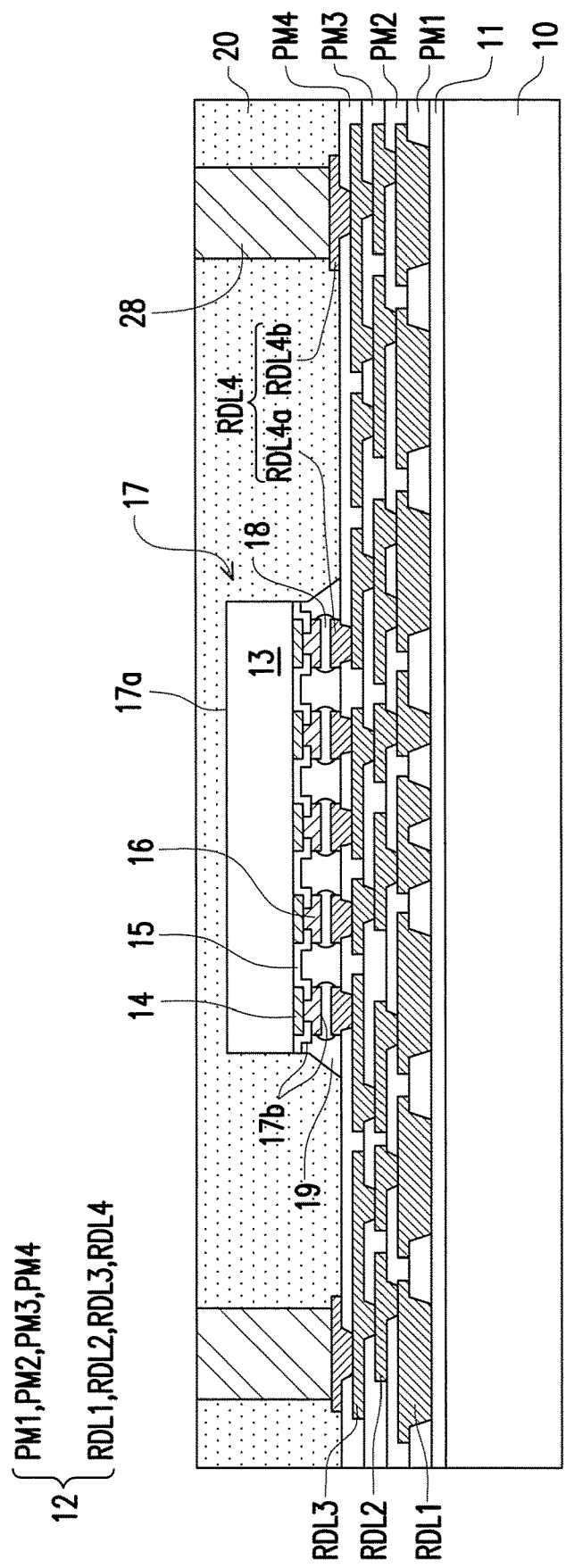

Referring to FIG. 3B, an encapsulant 20 is formed over the RDL structure 12, so as to encapsulate the sidewalls of the TIVs 28, the sidewalls and a portion of a surface of the RDL4*b*, the sidewalls of the underfill layer 19, the sidewalls and the first surface 17*a* of the die 17. The material of the encapsulant 20 is substantially the same as that of the first embodiment. The encapsulant 20 may be formed by forming an encapsulant material layer over the carrier 10. The encapsulant material layer encapsulates the top surfaces and sidewalls of the die 17 and the TIVs 28. Thereafter, a grinding or polishing process is performed to remove a portion of the encapsulant material layer, such that the top surfaces of the TIVs 28 are exposed. In some embodiments, the top surfaces of the TIVs 28 and the top surface of the encapsulant 20 are substantially coplanar and higher than or over the first surface 17*a* of the die 17, but the present disclosure is not limited thereto.

Figure 3C:
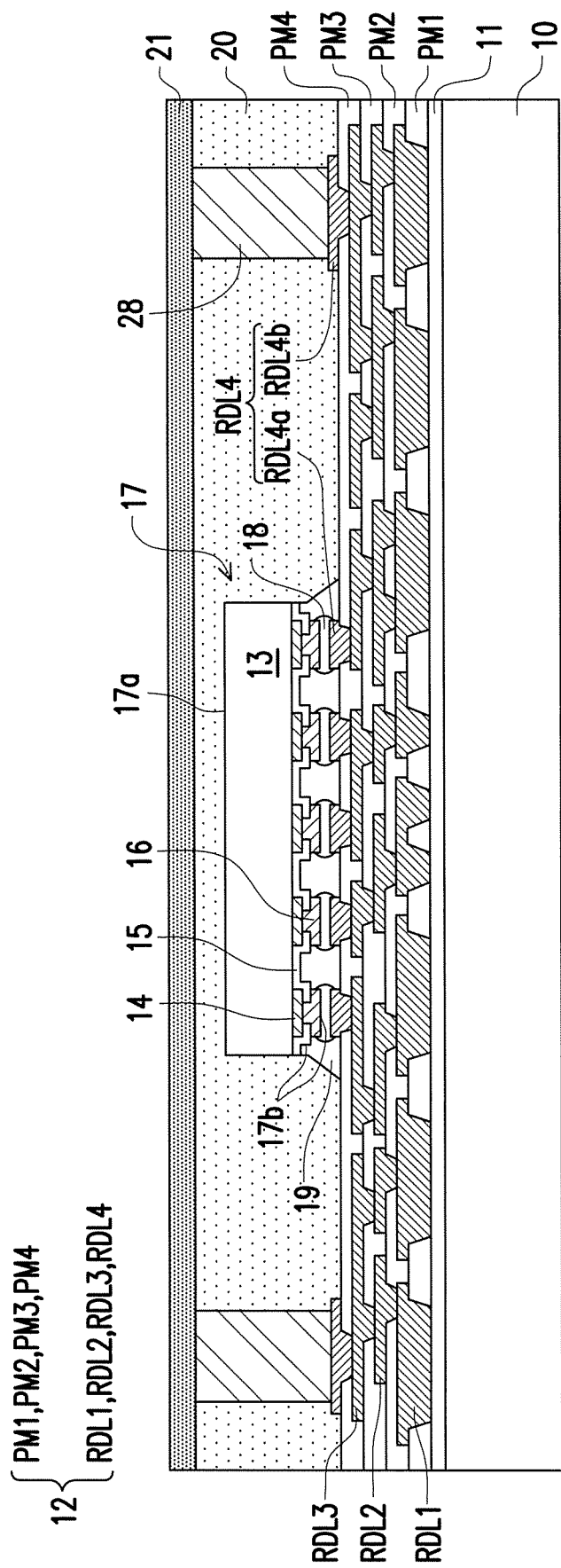

Referring to FIG. 3B and FIG. 3C, a protection layer 21 is then formed over the die 17, the encapsulant 20 and the TIVs 28. In some embodiments, the protection layer 21 is referred as a warpage control layer. The material and the forming method of the protection layer 21 are similar to those of the first embodiments.

Figure 3D:
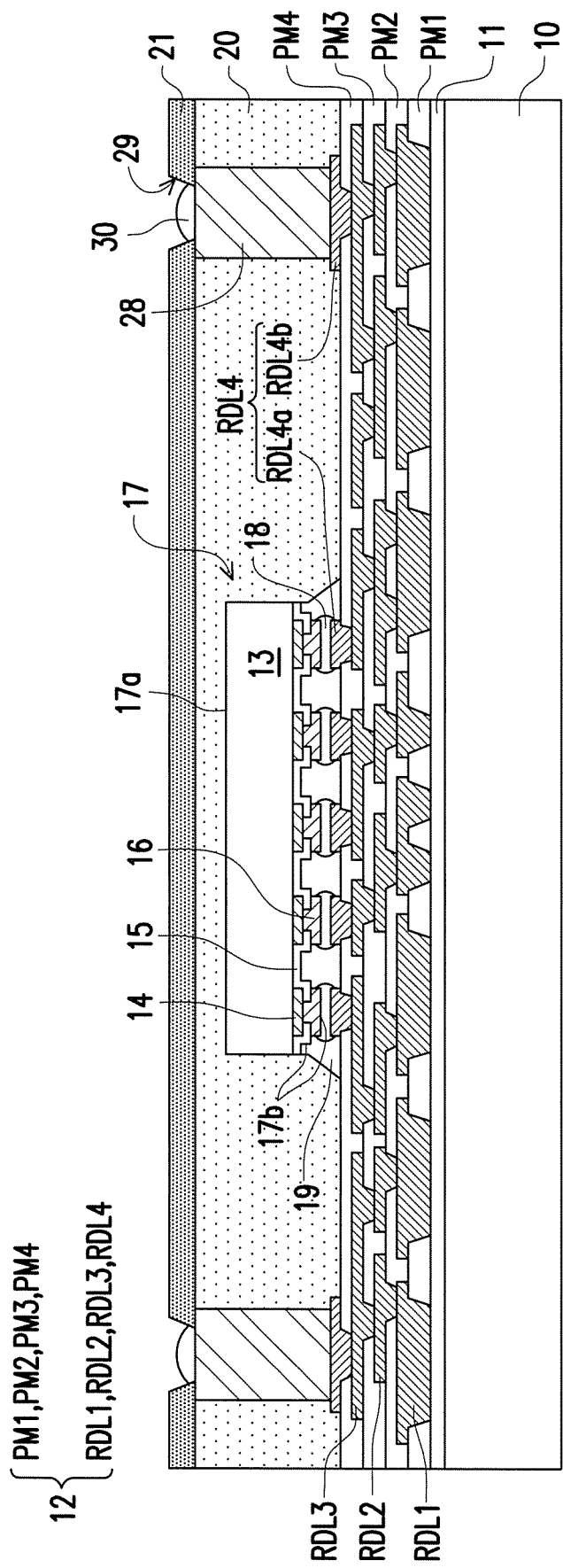

Referring to FIG. 3C and FIG. 3D, a portion of the protection layer 21 is removed to form a plurality of openings 29. The removal method includes exposure and development processes, laser drilling process, photolithography and etching processes, or a combination thereof. The opening 29 penetrates through the protection layer 21 to expose a portion of the top surface of the TIV 28. The opening 29 is also referred as a recess.

Still referring to FIG. 3D, thereafter, a plurality of caps 30 are formed in the openings 29 and on the TIVs 28. In some embodiments, the caps 30 are formed for protecting the TIVs 28 from oxidation or pollution. The cap 30 includes metal, organic material, or a combination thereof. In some embodiments, the cap 30 includes solder, solder paste adhesive or a combination thereof, and the cap 30 may be formed by dropping solder balls in the openings 29 and then a reflow process is performed. In some other embodiments, the cap 30 includes an organic material, such as an organic solderability preservative (OSP), and the cap 30 is referred as an OSP layer, such as a copper OSP layer. In some embodiments, the OSP layer includes benzotriazole, benzimidazoles, or combinations and derivatives thereof. In some embodiments, the OSP layer is formed by coating, and the OSP coating is applied by immersing the surfaces of the TIVs 28 exposed in the openings 29 in an OSP solution, or spaying an OSP solution on the surfaces of the TIVs 28 exposed in the openings 29. The OSP solution may contain alkylimidazole, benzotriazole, rosin, rosin esters, or benzimidazole compounds. Alternatively, the OSP coating is made with phenylimidazole or other imidazole compounds including 2-arylimidazole as the active ingredient.

In some embodiments, the cap 30 is formed within the opening 29, and the top surface of the cap 30 is lower than the top surface of the protection layer 21, but the disclosure is not limited thereto. In some other embodiments, the cap 30 may filled up the opening 29 and protrudes from the top surface of the protection layer 21. The cross-section shape of the cap 30 may be inverted trapezoid, inverted trapezoid with a arced base, square, rectangle, semicircular, or any other shape, as long as the cap 30 covers the TIV 28 to protect the TIV 28 from oxidation.

Figure 3E:
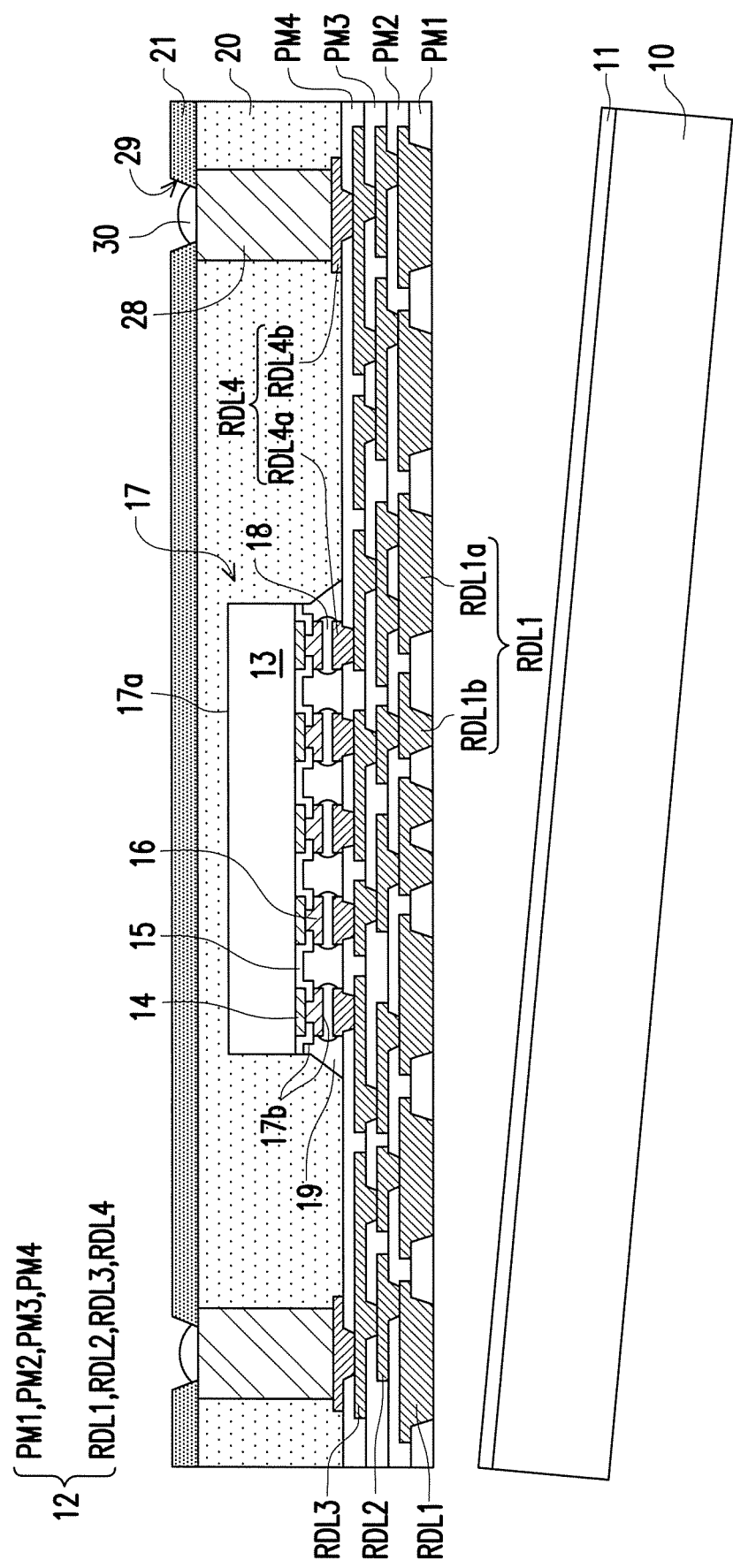
Figure 3F:
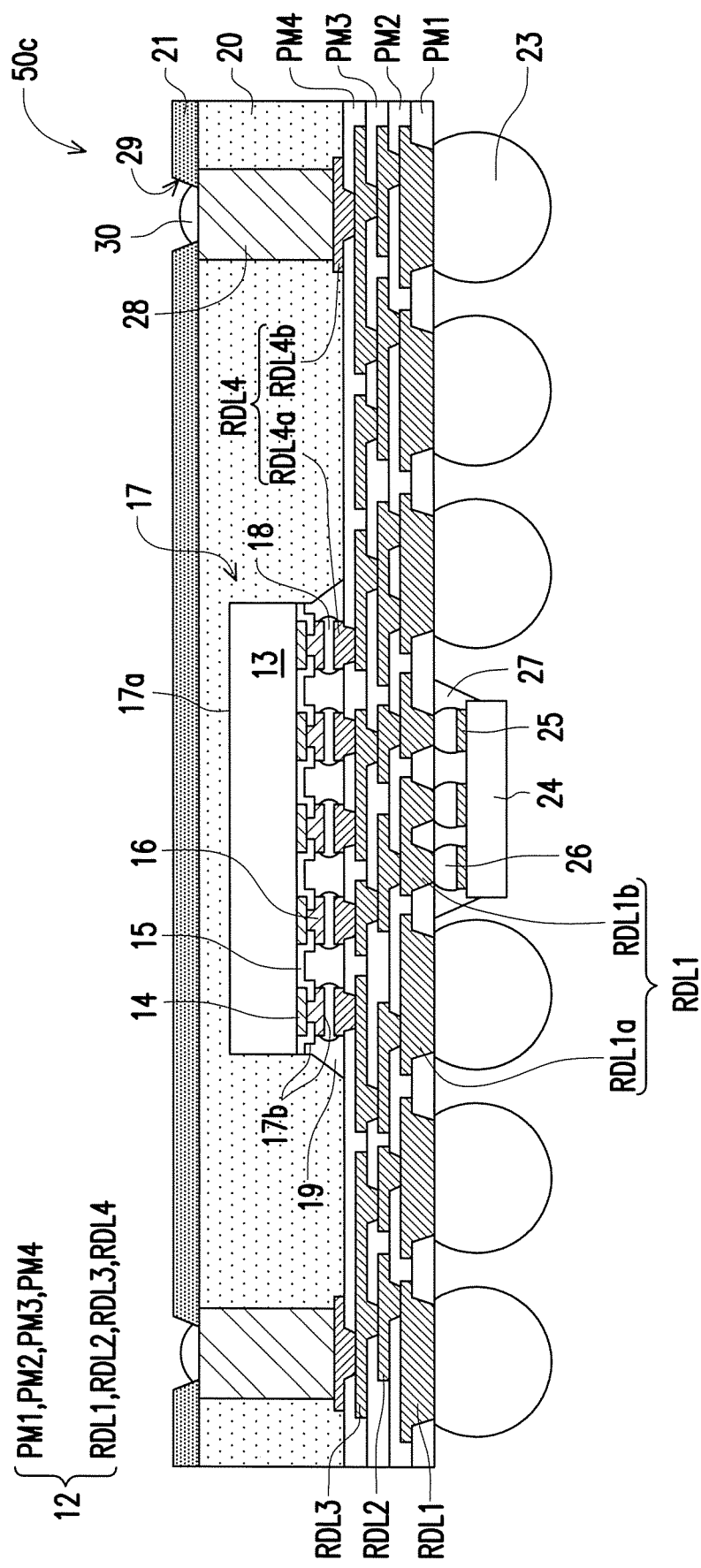

Referring to FIG. 3E and FIG. 3F, processes similar to FIG. 1E and FIG. 1F are performed, so as to form a package structure 50*c*. The de-bonding layer 11 is decomposed under the heat of light, and the carrier 10 is then released from the overlying structure. Thereafter, a plurality of connectors 23 are formed on and electrically connected to the redistribution layer RDL1*a* of the RDL structure 12. An IPD 24 is electrically connected to the redistribution layer RDL1*b* through a plurality of conductive bumps 26.

Referring to FIG. 3F, the package structure 50*c* is thus completed. The package structure 50*c* includes the die 17, the encapsulant 20, the TIVs 28, the RDL structure 12, the connectors 23, the IPD 24 and the protection layer 21. The protection layer 21 covers and contacts with the top surface of the encapsulant 20, and a portion of the top surface of the TIVs 28. The protection layer 21 has a plurality of openings 29 exposing the TIVs 28, and a plurality of caps 30 are located in the openings 29 to protect the TIVs 28 from oxidation or pollution. That is to say, a portion of the top surface of the TIV 28 is covered by the protection layer 21, and another portion of the top surface of the TIV 28 is covered by the cap 30.

Figure 3G:
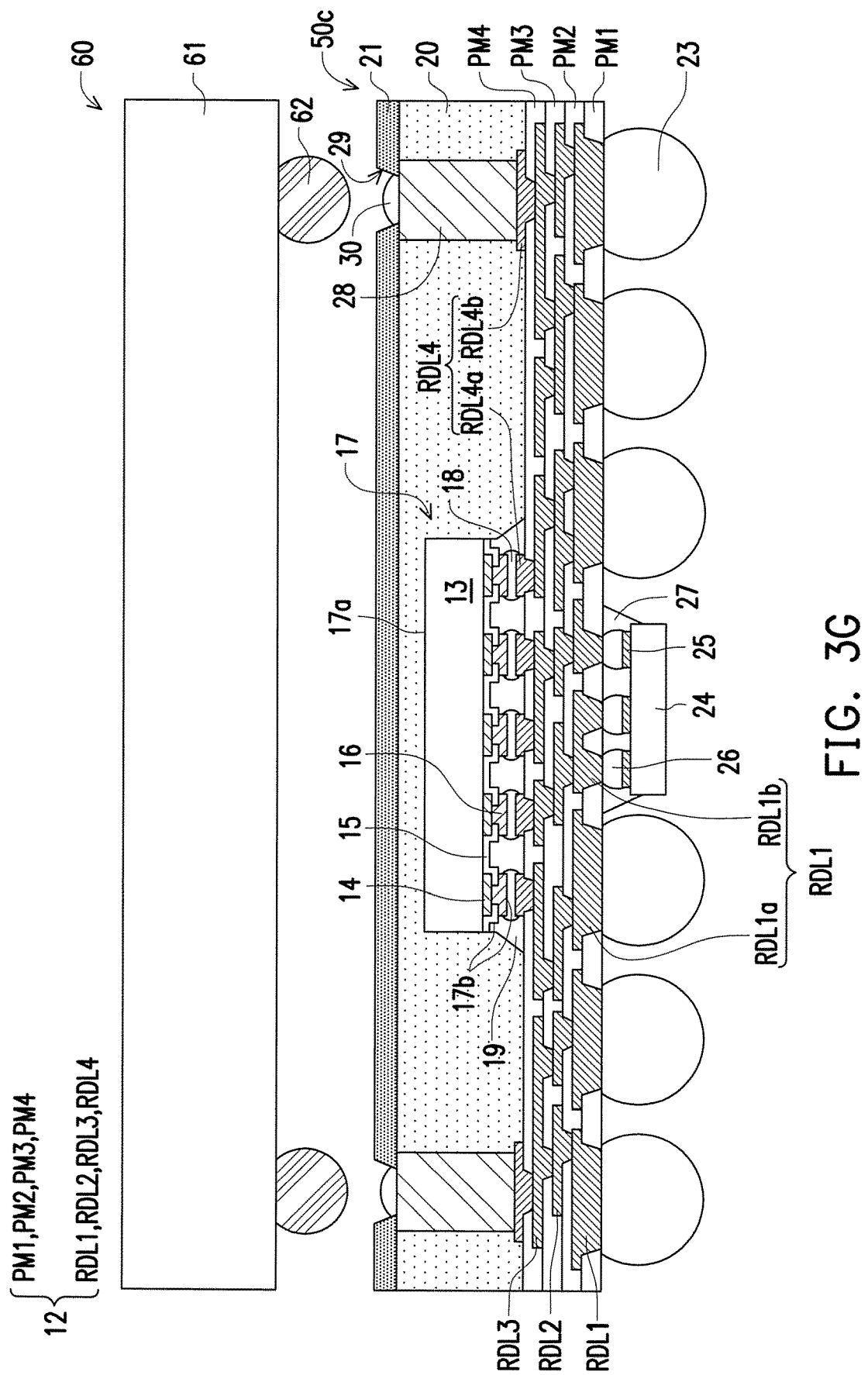
Figure 3H:
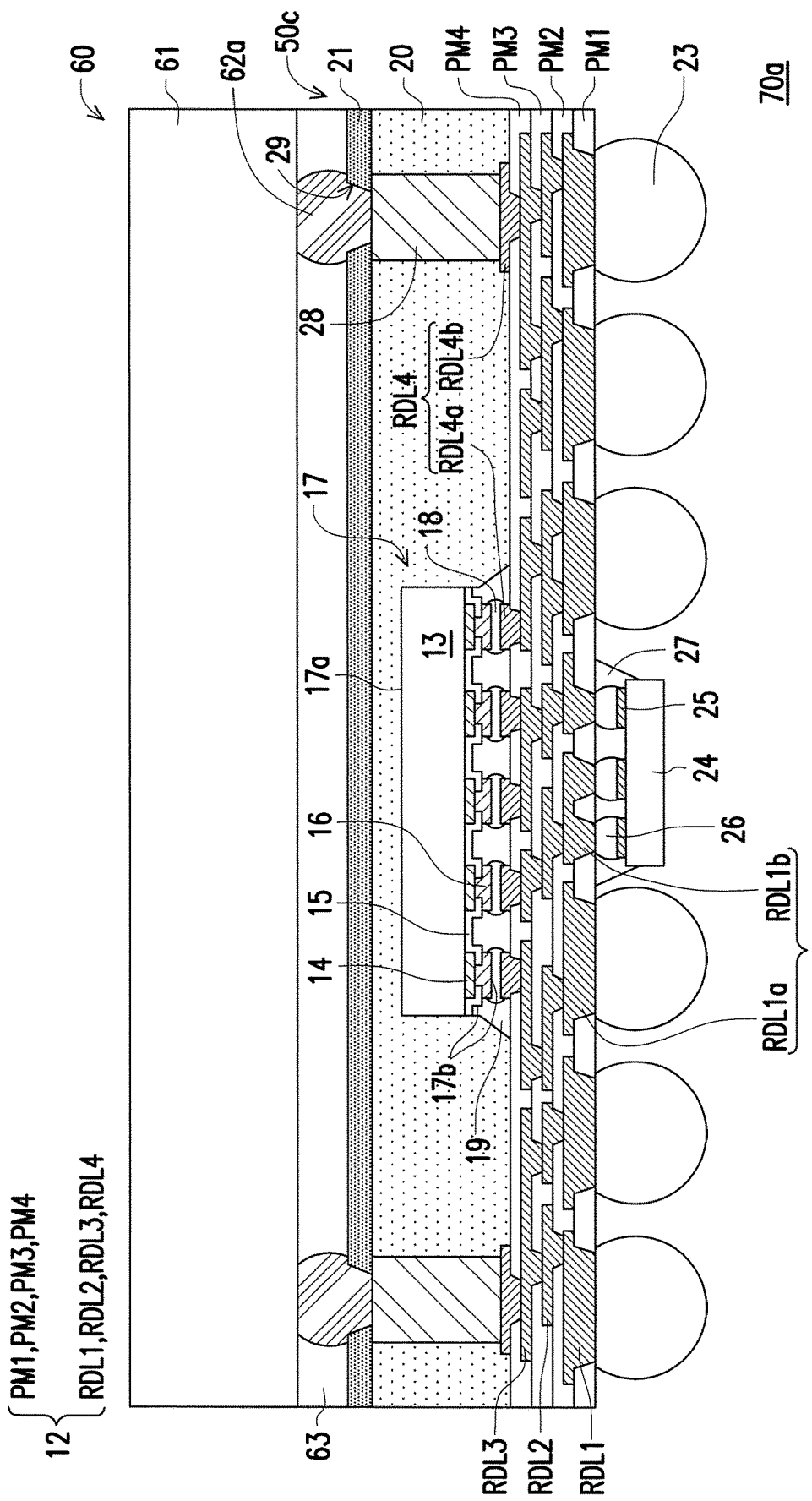

Referring to FIG. 3G and FIG. 3H, in some embodiments, the package structure 50*c* is further connected to a package structure 60 to form a package-on-package (PoP) device 70*a*.

Referring to FIG. 3G, the package structure 60 is provided. The package structure 60 may be any kind of package structures according to the functional demand of the PoP device 70*a*. In some embodiments, the package structure 60 includes a package body 61 and a plurality of connectors 62 attached to the package body 61. In some embodiments, the connectors 62 are referred as conductive terminals. The material and the forming method of the connector 62 are similar to those of the connector 23 of the package structure 50*c*. In some embodiments, the connectors 62 are located at the positions corresponding to the positions of the openings 29 of the package structure 50*c*.

Referring to FIG. 3G and FIG. 3H, a reflow process is performed at least on the connectors 62, so that a connector 62*a* is formed to connect the package structure 50*c* and the package structure 60. The connectors 62*a* are in electrical contact with the TIVs 28. In some embodiments in which the cap 30 is formed of solder, solder paste adhesive or a combination thereof, the cap 30 is melted and fused with the connector 62 during the reflow process, that is, the connector 62*a* is formed of the connector 62 and the cap 30. In some embodiments in which the cap 30 is an OSP layer, before the reflow process is performed, a cleaning process is performed to remove the cap 30, that is, the connector 62*a* is formed of the connector 62.

Referring to FIG. 3H, in some embodiments, an underfill layer 63 is further formed to fill the space between the package structure 50c and the package structure 60 and surround the connectors 62a. The PoP device 70a including the package structure 50c and the package structure 60 is thus completed, and the package structure 50c and the package structure 60 are connected through the connectors 62a. The PoP device 70a as shown in FIG. 3H is just for illustration, and the disclosure is not limited thereto.

Figure 4A:
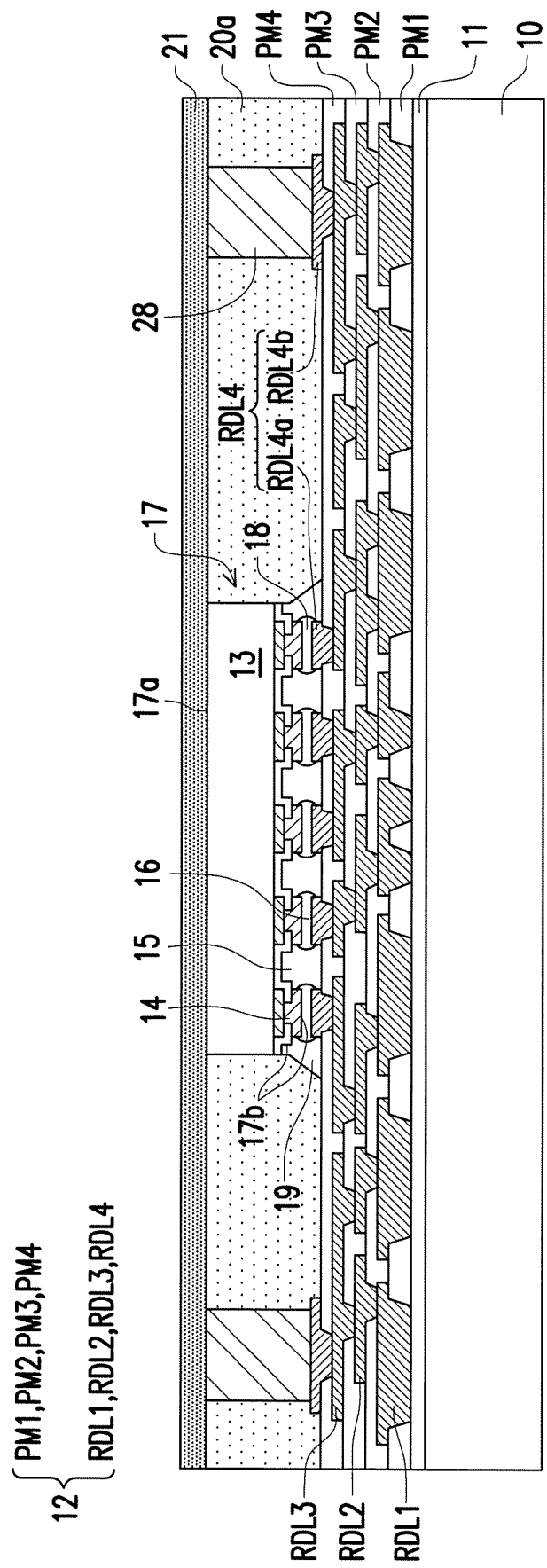
FIG. 4A to FIG. 4C are schematic cross-sectional views illustrating a method of manufacturing a package structure according to some embodiments of the disclosure.
Figure 4B:
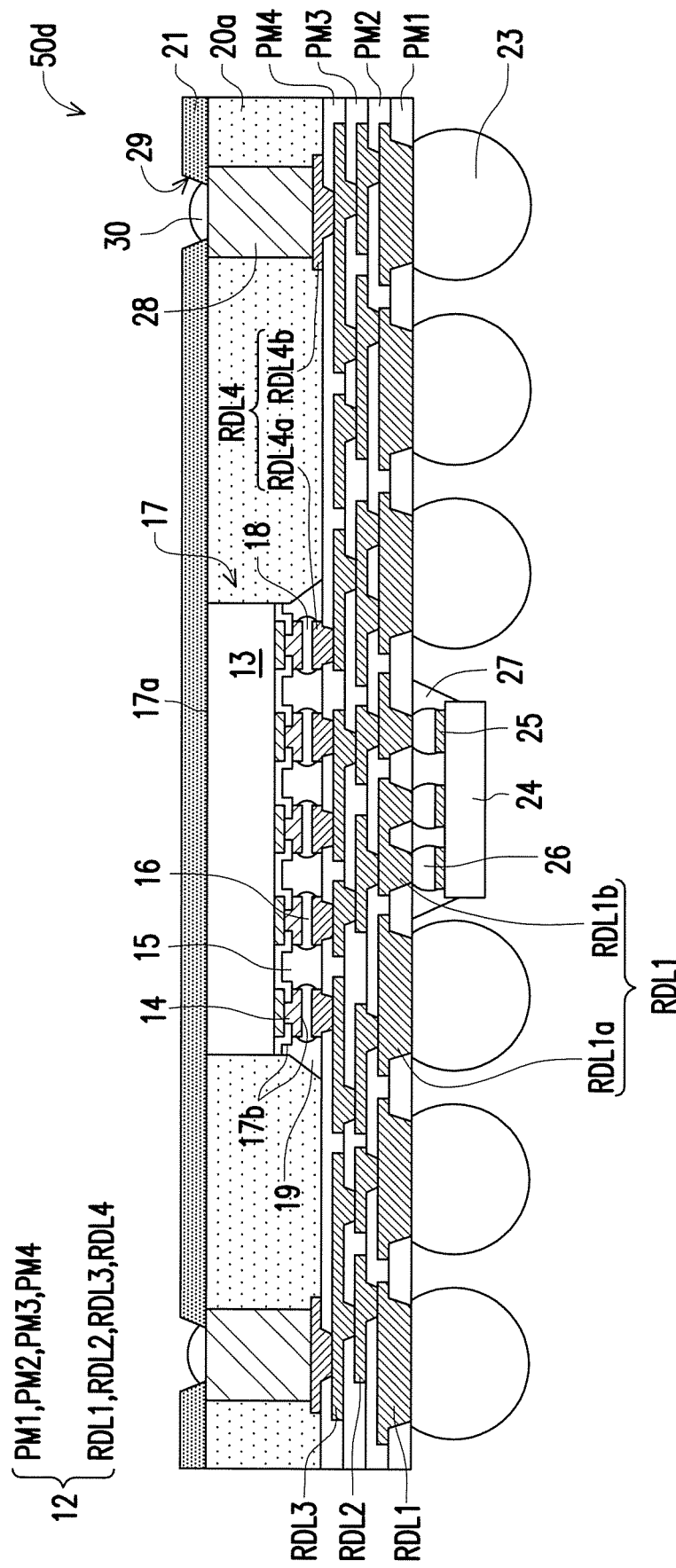

Referring to FIG. 3B, FIG. 4A and FIG. 4B, in some other embodiments, after the encapsulant 20 is formed as shown in FIG. 3B, the grinding or polishing process is performed, such that the top surfaces of the TIVs 28 and the first surface 17a of the die 17 are exposed, and an encapsulant 20a is formed. In some embodiments in which the TIVs 28 are formed with a top surface higher than the first surface 17a of the die 17, a portion of the encapsulant 20 and a portion of the TIVs 28 are removed during the grinding or polishing process. In some embodiments in which the TIVs 28 are formed with a top surface substantially level with the first surface 17a of the die 17, a portion of the encapsulant 20 is removed during the grinding or polishing process. In some embodiments, the top surfaces of the TIVs 28, the top surface of the encapsulant 20a and the first surface 17a of the die are substantially coplanar with each other. In other words, the protection layer 21 is in contact with the first surface 17a of the die 17, the top surface of the TIVs 28, and the top surface of the encapsulant 20a. In some embodiments, the protection layer 21 completely covers the first surface 17a of the die 17, the top surface of the TIVs 28, and the top surface of the encapsulant 20a.

Referring to FIG. 4B, a package structure 50d is then formed through the processes similar to those of FIG. 3C to FIG. 3F.

Referring to FIG. 3F and FIG. 4B, the package structure 50d differs from the package structure 50c in that the top surfaces of the TIVs 28, the top surface of the encapsulant 20a and the first surface 17a of the die 17 are coplanar with each other, and the protection layer 21 is in contact with the first surface 17a of the die 17. Other structural characteristics of the package structure 50d are similar to those of the package structure 50c. Similarly, the package structure 50d may further connected to other package structures to form a PoP device.

Figure 4C:
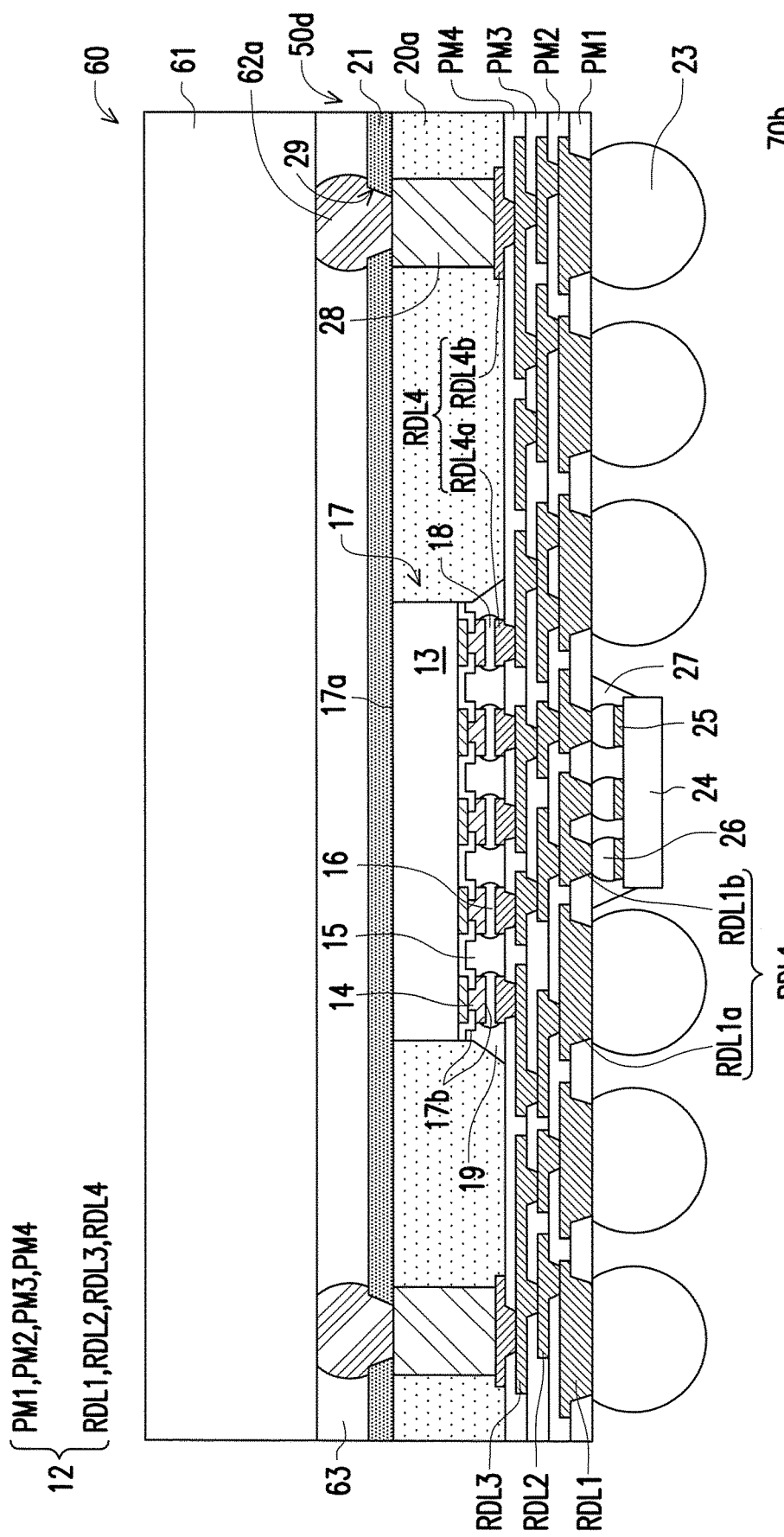

Referring to FIG. 4B and FIG. 4C, processes similar to those of FIG. 3G to FIG. 3H are performed, such that the package structure 50d is connected to a package structure 60, and a PoP device 70b is formed.

Figure 5A:
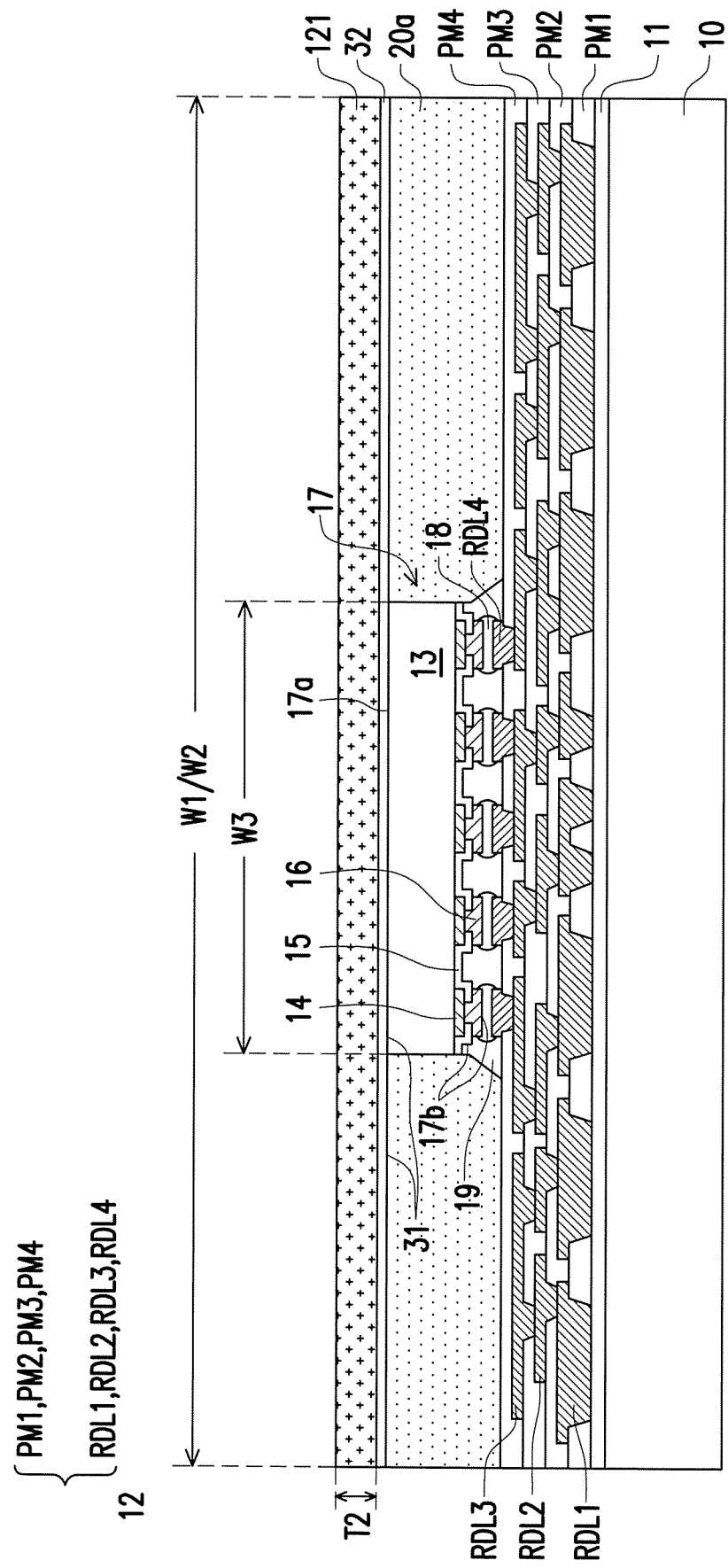
FIG. 5A to FIG. 5B are schematic cross-sectional views illustrating a method of manufacturing a package structure according to a third embodiment of the disclosure.
Figure 5B:
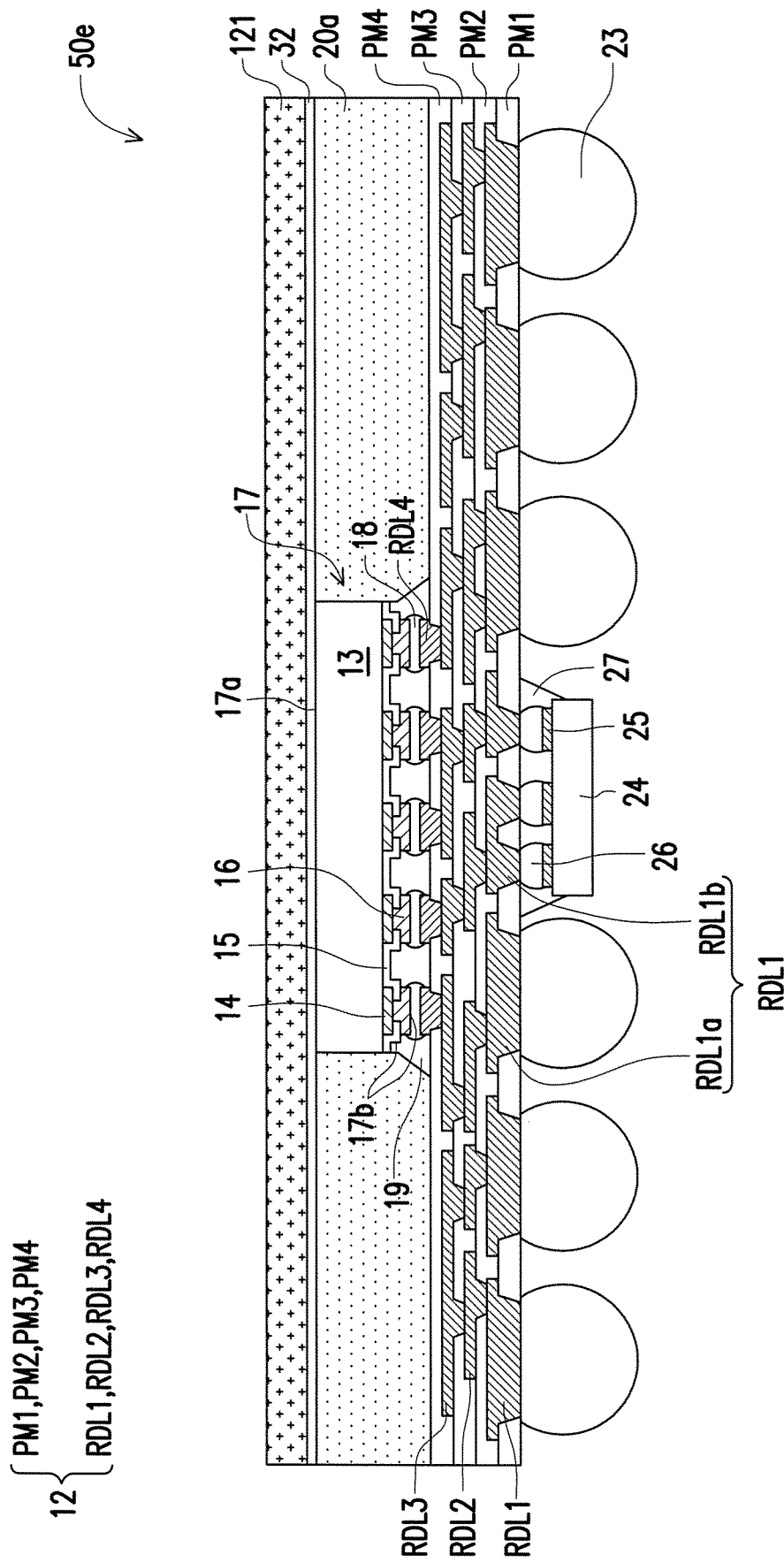

FIG. 5A to FIG. 5B are schematic cross-sectional views illustrating a method of manufacturing a package structure according to a third embodiment of the disclosure. The third embodiment differs from the foregoing embodiments in that a protection layer 121 is formed at the back side of the die 17. In some embodiments, the protection layer 121 acts as a warpage control layer and a heat spreader.

Referring to FIG. 2A and FIG. 5A, in some embodiments, after the encapsulant 20a is formed aside the die 17, the top surface of the encapsulant 20a and the first surface 17a of the die 17 form a surface 31. A protection layer 121 is attached to the surface 31 through an adhesive layer 32. The adhesive layer 32 is in contact with the die 17 and the encapsulant 20a. In some embodiments, the protection layer 121 is a plate or a sheet, and acts as a warpage control layer for preventing or reducing the warpage of the underlying structure, and also act as a heat spreader conducting heat away from the die 17. In some embodiments, the adhesive layer 32 may also help to conduct heat away from the die 17.

The protection layer 121 may include single material or composite material, and may be a single-layer structure or a multi-layer structure. In some embodiments, the protection layer 121 includes a thermally conductive material, and has a thermal conductivity greater than the die 17 and the encapsulant 20a. In some embodiments, the protection layer 121 includes a conductive material and is floating, that is to say, the protection layer 121 is not electrically connected to any other layers. In some embodiments, the protection layer 121 includes a rigid metal (such as copper, steel, or a combination thereof), a ceramic material, a silicon containing material, diamond, or a combination thereof. In some embodiments, the protection layer 121 is a copper layer, a steel layer, or a diamond film. In some other embodiments, the protection layer 121 includes a composite material composed of a matrix material and fillers. In some embodiments, the matrix material includes graphite, graphene, a polymer or a combination thereof. The fillers include diamond, oxide such as aluminum oxide or silicon oxide, carbide such as silicon carbide, or a combination thereof. However, the material of the protection layer 121 is not limited to those described above, the protection layer 121 may include any material, as long as the protection layer 121 preferably provides a sufficient degree of rigidity to present or reduce the warpage of the underlying structure and also effectively conducts heat away from the die 17.

In some embodiments, the adhesive layer 32 includes a die attach film (DAF), a thermal interface material (TIM), or a combination thereof. In some embodiments, the material of the adhesive layer 32 is also thermally conductive, and has a thermal conductivity greater than the die 17 and the encapsulant 20a. In some embodiments, the thermal conductivity of the adhesive layer 32 and the thermal conductivity of the protection layer 121 may be the same or different. In some embodiments, the thermal conductivity of the adhesive layer 32 may be greater or less than the thermal conductivity of the protection layer 121.

Still referring to FIG. 5A, in some embodiments, the thickness T2 of the protection layer 121 ranges from 30 μm to 400 μm. The thickness T2 of the protection layer 121 is dependent on the material thereof. In some embodiments in which the protection layer 121 is a diamond film, the thickness T2 of the protection layer 121 may be less than 30 μm. In some embodiments, the width W1 of the protection layer 121 is substantially the same as the width W2 of the surface 31. The first surface 17a of the die 17 and the top surface of the encapsulant 20a are covered by the protection layer 121. In some embodiments, the first surface 17a of the die 17 and the top surface of the encapsulant 20a are completely covered by the protection layer 121. In some other embodiments, the width W1 of the protection layer 121 is less than the width W2 of the surface 31, and greater than the width W3 of the die 17. That is, the first surface 17a of the die 17 and a portion of the top surface of the encapsulant 20a are covered by the protection layer 121. In yet alternative embodiments, the width W1 of the protection layer 121 may be substantially the same as or slightly less than the width W3 of the first surface 17a of the die 17, thus the first surface 17a of the die 17 is covered or partially covered by the protection layer 121. That is to say, the thickness T2 and the width W1 of the protection layer 121 may be adjusted, as long as the protection layer 121 provides the properties necessary to achieve the objectives of the present disclosure.

Referring to FIG. 5A and FIG. 5B, thereafter, processes similar to those of FIG. 1E to FIG. 1F are performed, such that the carrier 10 is released with the de-bonding layer 11 decomposed under the heat of light. Thereafter, a plurality of connectors 23 are electrically connected to the redistribution layer RDL1a of the RDL structure 12. An IPD 24 is electrically connected to the redistribution layer RDL1b through a plurality of conductive bumps 26.

Referring to FIG. 5B, a package structure 50e is thus completed. The package structure 50e includes the die 17, the encapsulant 20a, the RDL structure 12, the connectors 23, the IPD 24, and the protection layer 121. In some embodiments, the protection layer 121 is used for controlling the warpage of the package structure 50e and for spreading the heat of the die 17. The other structural characteristics are similar to those of the package structure 50b.

FIG. 6A to FIG. 6D are schematic cross-sectional views illustrating a method of manufacturing a package structure according to a fourth embodiment of the disclosure. The forth embodiment differs from the third embodiment in that a plurality of TIVs 28 are formed aside the die 17.

Figure 6A:
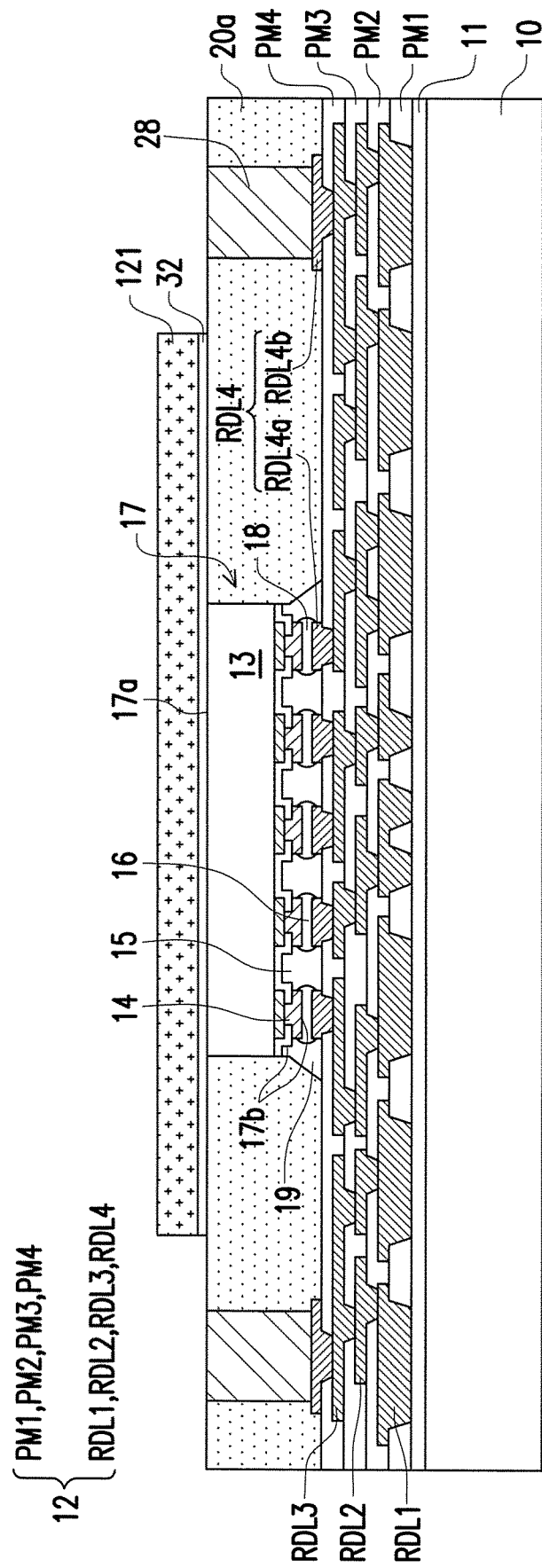
FIG. 6A to FIG. 6D are schematic cross-sectional views illustrating a method of manufacturing a package structure according to a fourth embodiment of the disclosure.

Referring to FIG. 6A, after the TIVs 28 and the encapsulant 20a is formed aside the die 17 (as shown in FIG. 4A), a protection layer 121 is attached to the die 17 and the encapsulant 20a through an adhesive layer 32. In some embodiments, the protection layer 121 covers the first surface 17a of the die 17 and a portion of the top surface of the encapsulant 20a. The TIVs 28 are not covered by the protection layer 121, and exposed. In some other embodiments, the protection layer 121 only covers or partially covers the first surface 17a of the die 17, and does not cover the top surface of the encapsulant 20a and the TIV 28. The material of the protection layer 121 and the material of the adhesive layer 32 are substantially the same as those of the third embodiment.

Figure 6B:
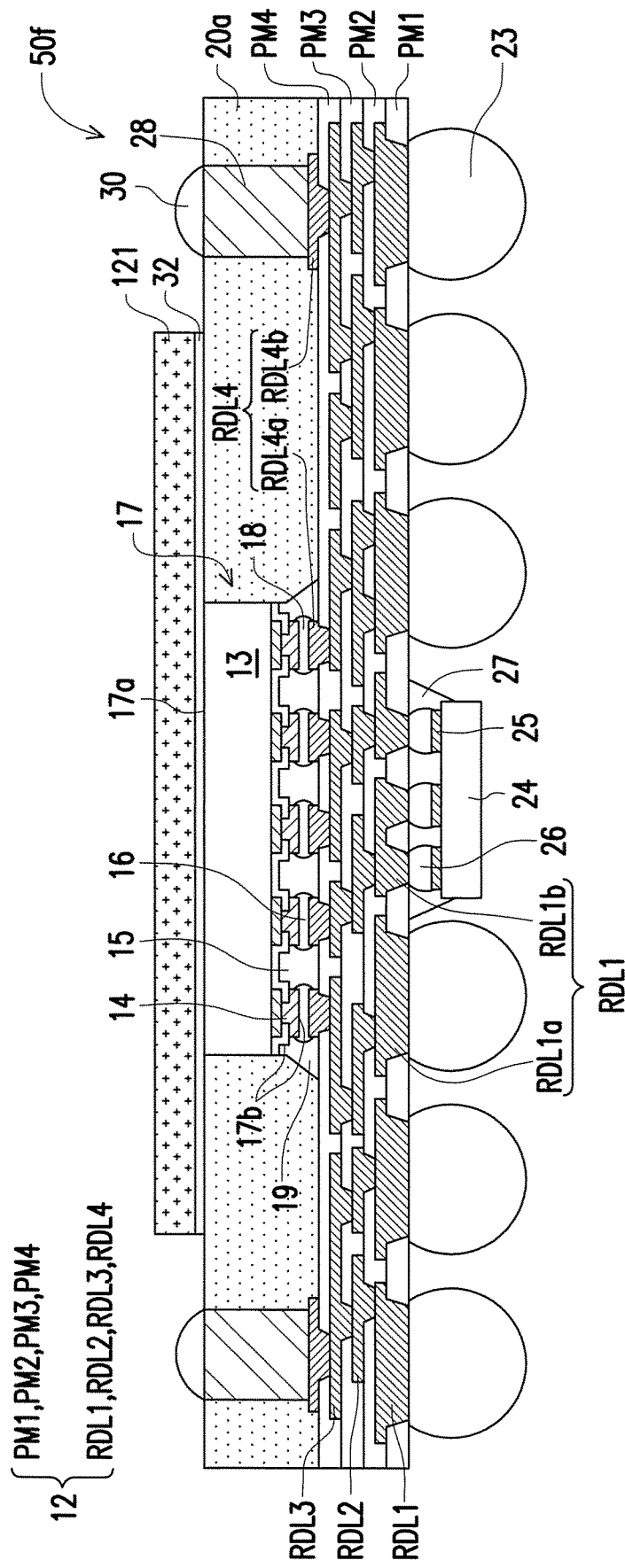

Referring to FIG. 6A and FIG. 6B, a plurality of caps 30 are formed on the TIVs 28 to at least cover the top surfaces of the TIVs 28. In some embodiments, the top surface of the TIV 28 is completely covered by the cap 30. In some embodiments, the top surface of the TIV 28 and a portion of the top surface of the encapsulant 20a are covered by the cap 30. The material, forming method and the properties of the cap 30 are similar to those of the second embodiment. In some embodiments, the cross-section shape of the cap 30 may be semicircular, arc-shaped, square, rectangle, trapezoid, or a combination thereof. The cap 30 may be any shape, as long as the TIV 28 is covered and protected from oxidation or pollution.

Still referring to FIG. 6A and FIG. 6B, the carrier 10 is released with the de-bonding layer 11 decomposed under the heat of light. Thereafter, a plurality of connectors 23 are electrically connected to the redistribution layer RDL1a of the RDL structure 12. An IPD 24 is electrically connected to the redistribution layer RDL1b through a plurality of conductive bumps 26.

Referring to FIG. 6B, a package structure 50f is thus completed, The package structure 50f includes the die 17, the encapsulant 20a, the TIVs 28, the RDL structure 12, the connectors 23, the IPD 24 and the protection layer 121. The TIVs 28 are covered by the caps 30. In some embodiments, the TIVs 28 are covered to be protected from oxidation or pollution. In some embodiments, the protection layer 121 is used for controlling the warpage of the package structure 50f and spreading the heat of the die 17. The package structure 50f may further coupled to other package structures to form a PoP device.

Figure 6C:
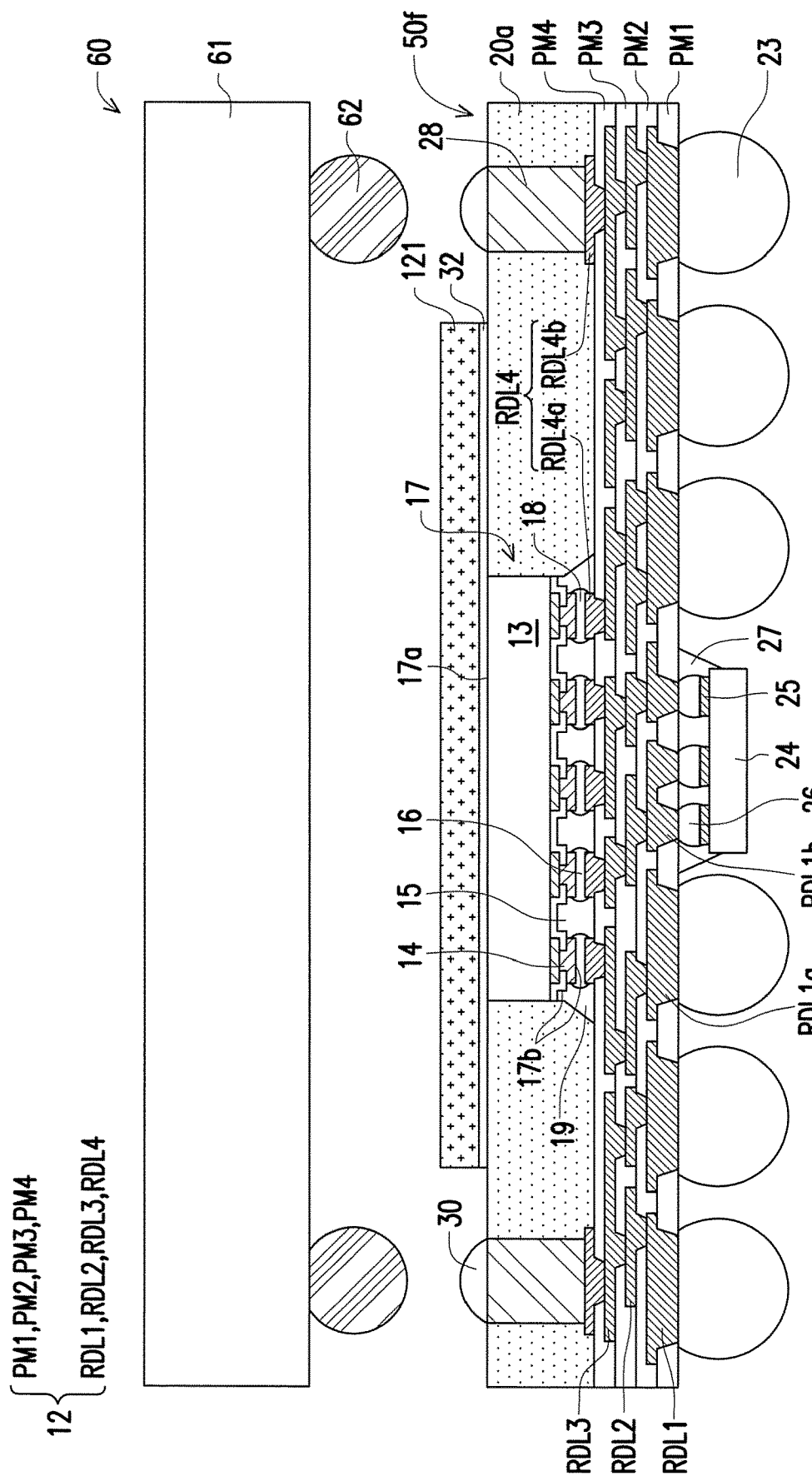
Figure 6D:
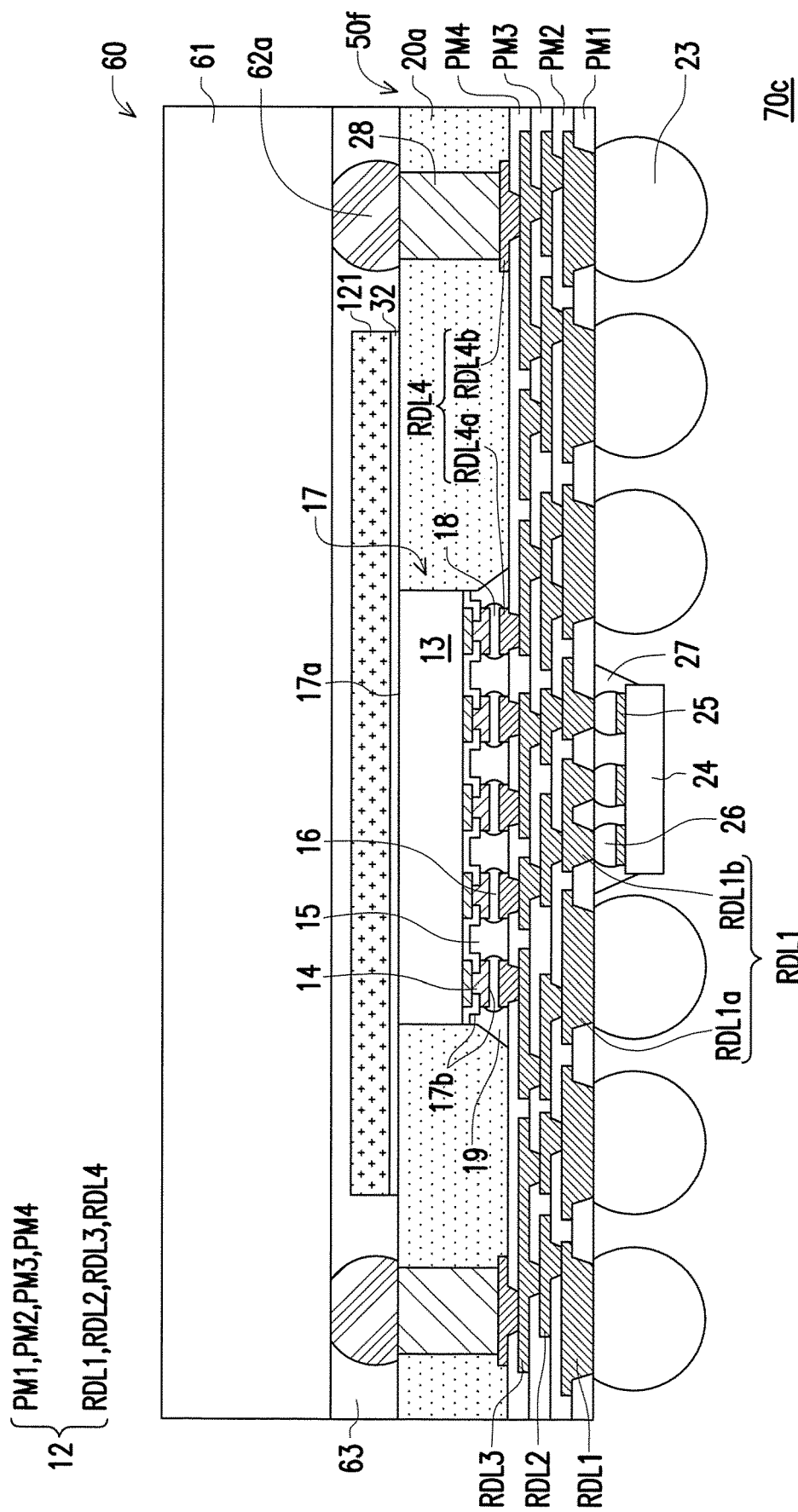

Referring to FIG. 6C and FIG. 6D, in some embodiments, a package structure 60 including a package body 61 and a plurality of connectors 62 is provided, thereafter a reflow process is performed, such that a connector 62a is formed to connect the package structure 50f and the package structure 60. Similar to the second embodiments, the connector 62a may be formed of the connector 62 or formed of the connector 62 and the cap 30, the forming method of the connector 62a is similar to that of the second embodiment as shown in FIG. 3G to FIG. 3H.

Thereafter, an underfill layer 63 is formed to fill the space between the package structure 50f and the package structure 60, and a PoP device 70c is thus completed.

In the second and the fourth embodiments, as shown in FIG. 3H, FIG. 4C and FIG. 6D, the package structure 50c/50d/50f is connected to the package structure 60, so as to form a PoP device 70a/70b/70c, however, the number of the package structures that may be coupled to the package structure 50c/50d/50f is not limited thereto. In some other embodiments, more than one package structures are connected to the package structure 50c/50d/50f, and IPDs may also be coupled to the package structure 50c/50d/50f. For the sake of brevity, the package structure 50c is taken for example.

Figure 7:
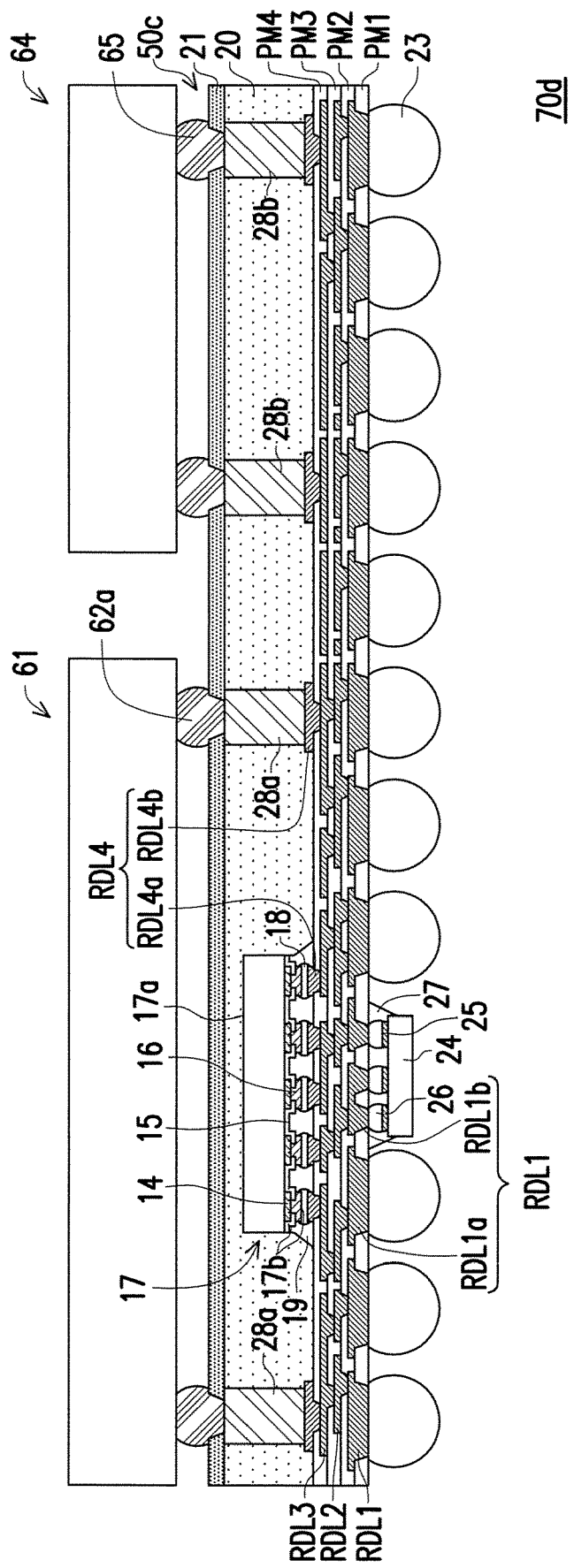
FIG. 7 and FIG. 8 respectively illustrate a PoP device according to some embodiments of the disclosure.

Referring to FIG. 7, in some embodiments, a PoP device 70d comprising a package structure 50c, a package structure 61 and a package structure 64 is formed. The package structure 50c includes a plurality of TIVs 28. The TIVs 28 includes a plurality of TIVs 28a and a plurality of TIVs 28b. The TIVs 28a are aside and around the die 17. The TIVs 28b are aside the TIVs 28a and relatively farther away from the die 17 than the TIVs 28a, that is to say, no die is surrounded by the TIVs 28b, but the disclosure is not limited thereto.

Still referring to FIG. 7, the package structure 61 is electrically coupled to the package structure 50c through the connectors 62a. A package structure 64 is electrically coupled to the package structure 50c though the connectors 65 by a similar method as described in the processes of FIG. 3G to FIG. 3H. The package structure 61 and the package structure 64 may be the same types or different types of package structures. The package structure 61 is connected to the TIVs 28a of the package structure 50c, and the package structure 64 is connected to the TIVs 28b of the package structure 50c.

Figure 8:
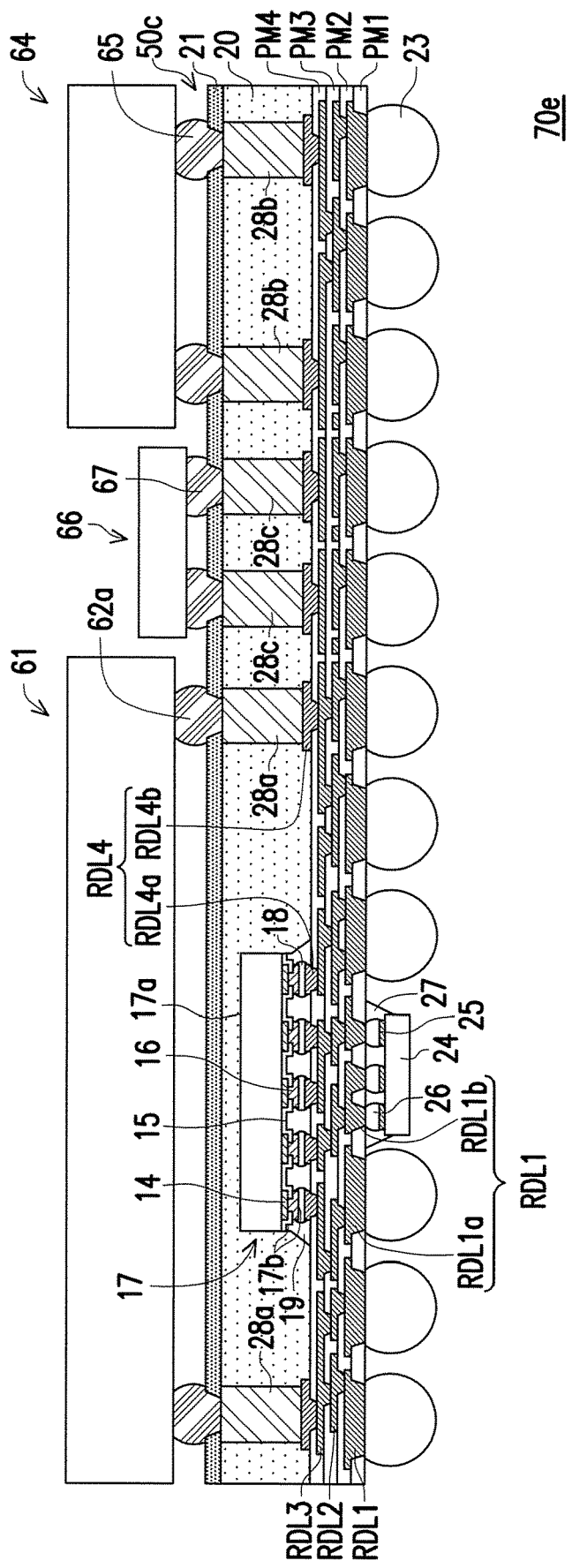

Referring to FIG. 8, in some embodiments, besides the package structure 61 and the package structure 64 are coupled to the package structure 50c, an IPD 66 is further electrically coupled to the package structure 50c through a plurality of connectors 67, and a PoP device 70e is thus completed. The IPD 66 may be a capacitor, a resistor, an inductor or the like, or a combination thereof. In some embodiments, the TIVs 28 includes a plurality of TIVs 28c between the TIVs 28a and the TIVs 28b. The package structure 61 is connected to the TIVs 28a. In some embodiments, the package structure 64 is connected to the TIVs 28b. The IPD 66 is connected to the TIVs 28c. The IPD 66 is located between the package structure 61 and the package structure 64, but the disclosure is not limited thereto.

In the present disclosure, a protection layer is formed at the backside of the die. In some embodiments, the protection layer acts as a warpage control layer to control warpage of the package structure. In some embodiments, the protection layer also acts as a heat spreader of the die.

In accordance with some embodiments of the disclosure, a package structure includes a die, an encapsulant, a RDL structure and a protection layer is provided. The die includes a first surface and a second surface opposite to each other. The encapsulant is aside the die. The RDL structure is electrically connected to the die though a plurality of conductive bumps. The RDL structure is below the second surface of the die and the encapsulant. The protection layer is located over the first surface of the die and the encapsulant. The protection layer is used for controlling the warpage of the package structure.

In accordance with some embodiments of the disclosure, a package structure includes a die, a TIV, an encapsulant, a RDL structure, a protection layer and a cap is provided. The TIV is aside the die. The encapsulant encapsulates sidewalls of the TIV and sidewalls of the die. The RDL structure is electrically connected to the die through a plurality of conductive bumps. The protection layer is located over the encapsulant, the TIV, and the die. The cap is located on the TIV, covering a portion of a top surface of the TIV. The protection layer is used for controlling warpage of the package structure.

In accordance with some embodiments of the disclosure, a method of manufacturing a package structure is provided. A die is connected to a RDL structure through a plurality of conductive bumps. An encapsulant is formed to at least encapsulate sidewalls of the die. A protection layer is formed over the encapsulant and the die, so as to control warpage of the package structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die, wherein the die comprises a first surface and a second surface opposite to each other;
   a through integrated fan-out via (TIV) aside the die;
   an encapsulant aside the die and the TIV;
   a redistribution layer (RDL) structure electrically connected to the die though a plurality of conductive bumps, wherein the RDL structure is below the second surface of the die and the encapsulant;
   a protection layer over the first surface of the die and the encapsulant; and
   a cap on the TIV and laterally aside the protection layer, wherein a top surface of the cap is higher than a top surface of the encapsulant and lower than a top surface of the protection layer,
   wherein the protection layer is used for controlling warpage of the package structure,
   wherein a portion of the top surface of the encapsulant is not covered by the protection layer.

2. The package structure of claim 1, wherein the second surface is an active surface facing the RDL structure.

3. The package structure of claim 2, wherein the top surface of the encapsulant is over the first surface of the die, and the encapsulant encapsulates sidewalls of the die.

4. The package structure of claim 2, wherein the top surface of the encapsulant is substantially coplanar with the first surface of the die.

5. The package structure of claim 1, wherein a top surface of the TIV is completely covered by the cap.

6. The package structure of claim 1, further comprises an adhesive layer between the protection layer and the die.

7. The package structure of claim 6, wherein the protection layer and the adhesive layer at least cover a portion of the first surface of the die, and the adhesive layer is in contact with the first surface of the die.

8. The package structure of claim 6, wherein the protection layer is used as a heat spreader.

9. The package structure of claim 1, wherein the portion of the top surface of the encapsulant not covered by the protection layer is laterally between the protection layer and the cap.

10. The package structure of claim 1, wherein a bottom surface of the cap is not lower than the top surface of the encapsulant.

11. A package structure, comprising:
    a die;
    a through integrated fan-out via (TIV) aside the die;
    an encapsulant encapsulating sidewalls of the TIV and sidewalls of the die; and
    an RDL structure electrically connected to the die through a plurality of conductive bumps;
    a protection layer over the encapsulant, the TIV, and the die; and
    a cap on the TIV and laterally surrounded by the protection layer,
    wherein the protection layer is used for controlling warpage of the package structure,
    wherein the protection layer and the cap are in contact with and overlap the TIV, and a top surface of the cap is higher than a top surface of the encapsulant and lower than a top surface of the protection layer.

12. The package structure of claim 11, wherein the cap is located in a recess of the protection layer, so as to cover a top surface of the TIV exposed in the recess.

13. The package structure of claim 12, wherein the top surface of the encapsulant, the top surface of the TIV and a top surface of the die are substantially coplanar with each other.

14. The package structure of claim 12, wherein the encapsulant further encapsulates a top surface of the die, and the top surface of the TIV and the top surface of the encapsulant are over the top surface of the die.

15. The package structure of claim 11, further comprises an adhesive layer between the protection layer and the die, wherein the protection layer at least covers a portion of a top surface of the die, and the protection layer is used as a heat spreader of the die.

16. The package structure of claim 11, wherein a top surface of the TIV is covered by and in physical contact with the protection layer and the cap.

17. A method of manufacturing a package structure, comprising:
    forming a RDL structure;
    connecting a die to the RDL structure through a plurality of conductive bumps;
    forming a TIV on the RDL structure and laterally aside the die;
    forming an encapsulant to at least encapsulate sidewalls of the die and sidewalls of the TIV;
    forming a protection layer over the encapsulant and the die, so as to control warpage of the package structure;
    removing a portion of the protection layer to form a recess in the protection layer after forming the TIV, the recess exposes at least a portion a top surface of the TIV; and
    forming a cap in the recess of the protection layer to cover the at least the portion of the top surface of the TIV,
    wherein a top surface of the cap is lower than a top surface of the protection layer.

18. The method of claim 17, wherein the top surface of the TIV is completely covered by the cap.

19. The method of claim 17, wherein the protection layer and the cap are in contact with and overlap the TIV.

20. The method of claim 17, further comprises attaching the protection layer to the die through an adhesive layer, wherein the top surface of the TIV is not covered by the protection layer.

* * * * *